(12) United States Patent
Tsutsumi et al.

(10) Patent No.: US 6,818,929 B2
(45) Date of Patent: Nov. 16, 2004

(54) STANDARD CELL FOR PLURAL POWER SUPPLIES AND RELATED TECHNOLOGIES

(75) Inventors: Masanori Tsutsumi, Kyoto (JP); Junichi Yano, Osaka (JP); Fumihiro Kimura, Nara (JP); Masayuki Matsuda, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/455,387

(22) Filed: Jun. 6, 2003

(65) Prior Publication Data
US 2003/0230769 A1 Dec. 18, 2003

(30) Foreign Application Priority Data
Jun. 18, 2002 (JP) ...................................... P2002-177054

(51) Int. Cl.[7] .............................................. H01L 27/10
(52) U.S. Cl. ...................... 257/204; 257/206; 257/207
(58) Field of Search ................................ 257/204, 206, 257/207, 758, 532, 369

(56) References Cited
U.S. PATENT DOCUMENTS 5,920,089 A    7/1999   Kanazawa et al.
6,307,222 B1   10/2001  Brunolli et al.
2001/0028069 A1 10/2001 Umemoto et al.
2003/0230769 A1 * 12/2003 Tsutsumi et al. ........... 257/207

FOREIGN PATENT DOCUMENTS

JP          6164331 A     6/1994
JP          10284609 A    10/1998

* cited by examiner

Primary Examiner—Mark V. Prenty
(74) Attorney, Agent, or Firm—McDermott Will & Emery LLP

(57) ABSTRACT

A standard cell for a plurality of power supplies comprises a first power line and a second power line electrically isolated from the first power line. An N well is arranged in spaced relation with the whole peripheral boundaries of the standard cell. In the case where the standard cells are arranged adjacently to each other in the direction along the power lines or in the direction orthogonal thereto, the N well in the standard cell for a plurality of power supplies is isolated from the N wells of the adjacent standard cells in the direction along the power lines or in the direction orthogonal thereto, as the case may be.

30 Claims, 25 Drawing Sheets

STANDARD CELL FOR PLURAL POWER SUPPLIES AND RELATED TECHNOLOGIES

BACKGROUND OF THE INVENTION

The present invention relates to a standard cell for a plurality of power supplies and technologies related thereto.

In recent years, the ever-increasing speed, integration and size of the semiconductor integrated circuits has led to the current use of a layout design using a standard cell library. On the other hand, the increased speed and integration of circuits have raised the problem of power consumption. The clock tree portion of the circuit attains large proportions of power consumption, and therefore the power consumption of the clock tree portion is required to be decreased.

As shown in FIG. 1, the standard cell (hereinafter sometimes referred to as the cell) of a standard cell library is configured of a power line 101, a grounding line 102, a transistor gate 103, an N well 104, a P well 105, a P-channel diffusion region 106 and an N-channel diffusion region 107.

In the case where two cell rows are arranged in the same direction as shown in FIG. 2A, all of the power lines 101 are located at the upper position, all of the grounding lines 102 are located at the lower position, and the two cell rows are separated from each other. In the case where the two cell rows are arranged in opposite directions with the power lines 101 at the central position and the grounding lines 102 at the top and bottom positions as shown in FIG. 2B, on the other hand, the N wells 104 of the two cell rows are in contact with each other. In this case, the two cell rows are not required to be separated from each other so that the area of the block can be reduced.

In a clock tree shown in FIG. 3, the clock signal is applied from a first clock buffer 202 at the center to a plurality of second clock buffers 203 radially arranged with equal distances. Further from the second clock buffers 203, the clock signal is supplied in radial direction synchronously to a plurality of flip-flops 201 with equal distances. By reducing the source voltage of the clock tree portion below that of the logic circuit portion, the power consumption of the clock tree portion can be reduced without reducing the operating frequency of the circuit.

In the circuit configuration shown in FIG. 4, the only requirement for the clock tree portion 204 including the first and second clock buffers 202, 203 is to maintain the synchronism of the clock signals. In view of this, only the clock tree portion 204 is reduced in voltage as compared with the supply potential to a circuit element string 205 including the flip-flops 201, 201. In this way, the power consumption for the whole circuit is reduced while securing the operating speed of the circuit element string 205.

Presence of the cell operating at different power voltages causes the short-circuit between the power line 101 and a water. This requires separation of the circuit-element string 205 corresponding to the power voltage.

In the case where the flip-flops and the clock buffers are arranged in different rows in the block, however, the distance is lengthened between the flip-flops and the clock buffers depending on the arrangement of the flip-flops. As a result, the wiring delay is increased, thereby posing the problem that the clock signals are undesirably input to the flip-flops at different timings.

Another problem is that the cell region of the clock buffers and the cell region of the logic circuit are required to be prepared separately from each other. This poses the problem of an increased block area.

The Japanese Unexamined Patent Publication No. 10-284609 discloses a technique in which a plurality of types of power lines having different source voltages are used in the case where there coexist a plurality of types of cells having different operating voltages in the same string.

In FIG. 5, the cells in an even-numbered row and an odd-numbered row are arranged in opposite directions provisionally so that the N wells of adjacent rows are kept in contact with each other. Even in the case where a standard cell Un (hereinafter referred to as the single-power-supply cell) for a single power supply and a standard cell Cp for a plurality of power supplies (hereinafter referred to as the plural-power-supply cell) are adjacent to each other in a vertical direction, the N well of the single power cell Un1 is contact with the N well of the plural-power-supply cell Cp. In view of the fact that the potential applied to the N well of the single-power-supply cell Un is different from the potential applied to the N well of the plural-power-supply cell Cp, however, a current flows and the potential of the N well of the plural-power-supply cell Cp undergoes a change. As a result, the source voltage is differentiated from the substrate voltage, so that the threshold voltage of the transistor changes and so does the operating speed thereof. In order to avoid this inconvenience, the cells in the upper row and the cells in the lower row are required to be arranged in spaced relation with each other. However, this raises the problem of an increased block area.

Also, the well is an independent entity in the cell, and the cell area is so small that a large substrate contact cannot be secured in the microprocessing, resulting in the problem that a sufficient latch-up strength cannot be obtained.

SUMMARY OF THE INVENTION

Accordingly, it is an main object of this invention to provide a technique for laying out a semiconductor integrated circuit having a plurality of source voltages without increasing the area of the block and provide a means for cutting the consumption power of the clock tree portion.

Other objects, features and advantages of the invention will be made apparent from the description below.

In order to solve the problem described above, according to a first aspect of the invention, there is provided a standard cell for a plurality of power supplies (hereinafter referred to as the plural-power-supply cell), comprising a first power line, a second power line isolated electrically from the first power line, an N well arranged in spaced relation with the whole periphery of the boundaries of the cell, a grounding line and a P well arranged in contact with the boundaries on both sides in the direction along the power lines of the cell (hereinafter sometimes referred to as the power-line direction) (FIG. 6).

With this configuration, even in the case where standard cells (hereinafter referred to as the cells) of different source voltages are arranged on the same row, the use of the first power line and the second power line makes it possible to arrange different power lines in isolation from each other. Further, even in the case where the cells are arranged adjacently to each other in the power-line direction or the direction orthogonal thereto, the N well of a plural-power-supply cell can be isolated from the N wells of adjacent cells (FIG. 9).

According to a second aspect of the invention, the second power line is formed in contact with the two boundaries along the power-line direction of the cell.

With this configuration, in the case where the plural-power-supply cells are arranged adjacently to each other, the first power lines and the second power lines of the cells can be connected to each other thereby to form a series of first power lines and a series of second power lines (FIG. 7).

According to a third aspect of the invention, the N well is electrically connected to the second power line, and the P well is electrically connected to the grounding line.

With this configuration, the second power line is connected to a power supply point of a semiconductor integrated circuit and the grounding line to the grounding point of the semiconductor integrated circuit, thereby making it possible to apply the source potential to the N well and the grounding potential to the P well.

According to a fourth aspect of the invention, the N well is electrically connected to the first power line or the second power line by a wiring or a contact.

With this configuration, in the wiring step corresponding to the last half of the fabrication process, the potential application to the N well in the cell can be switched between the first power line and the second power line. As a result, the requirement for a specification change involving a high-speed specification or a low-speed specification accompanied by a significant design change can be met faster than the original design for a faster fabrication process (FIG. 12).

According to a fifth aspect of the invention, the plural-power-supply cell has a decoupling capacitor connected to the second power line.

With this configuration, the power noise of the second power line can be suppressed by the decoupling capacitor (FIG. 13).

According to a sixth aspect of the invention, the plural-power-supply cell further has a third power line.

With this configuration, the potential application to the N well of the plural-power-supply cell can be switched between the first, second and third power lines in the wiring step (FIG. 18).

According to a seventh aspect of the invention, the plural-power-supply cell further has a second N well arranged at the two ends along the direction of the power lines of the cell.

With this configuration, the second N well of the plural-power-supply cell is in contact with the N well of a standard cell for a single power supply (hereinafter referred to as the single-power-supply cell) adjacent to the plural-power-supply cell, and therefore the area of the N well in the single-power-supply cell can be increased. Also two circuits of different source voltages can be secured in the cell (FIGS. 14, 15).

According to an eighth aspect of the invention, the second N well is electrically connected with the first power line.

With this configuration, a power potential can be applied to the second well by connecting the first power line to the power supply point of the semiconductor integrated circuit.

According to a ninth aspect of the invention, the plural-power-supply cell further has a third N well arranged in spaced relation with the boundaries on both sides along the power lines of the cell.

With this configuration, the plural-power-supply cell can have three circuits of different source voltages therein.

According to a tenth aspect of the invention, a standard cell library (hereinafter referred to as the library) comprising a first power line and a second power line electrically isolated from the first power line, an N well arranged in spaced relation with the boundaries on both sides along the direction orthogonal to the power lines of the cell, a grounding line and a P well arranged in contact with the boundaries on both sides along the direction of the power lines, wherein the standard cell library consists of a first cell including the N well arranged in spaced relation with the boundaries on both sides along the direction of the power lines of the cell, and a second cell including an N well arranged in contact with an end or the other end or the two ends along the direction of the power lines of the cell.

With this configuration, in the case where plural-power-supply cells are arranged adjacently to each other, the N wells of the plural-power-supply cells can be arranged in contact with each other by replacing the plural-power-supply cells with those having the N wells in contact with the boundary (FIGS. 16, 17(a) and 17(b)).

According to an 11th aspect of the invention, the library for a standard cell constitutes a plural-power-supply cell combined with a single-power-supply cell, wherein the plural-power-supply cell includes a first power line, a second power line electrically isolated from the first power line, an N well arranged in spaced relation with the whole periphery of the cell boundaries, a grounding line and a P well arranged in contact with the boundaries on both sides along the direction of the power lines, and wherein the single-power-supply cell includes a first power line, an N well arranged in contact with the boundaries on both sides along the direction of the power lines, a grounding line and a P well arranged in contact with the boundaries on both sides along the direction of the power lines.

With this configuration, the plural-power-supply cells and the single-power-supply cells can be used together in the same block, and by differentiating the source potential applied to the first power line from the source potential applied to the second power line, the cells operating at a plurality of source voltages can coexist in the same circuit (FIG. 6 for the plural-power-supply cell, FIG. 8 for the single-power-supply cell, and FIGS. 9, 11 for the cell combination).

According to a 12th aspect of the invention, the plural-power-supply cell has a height an integer multiple of the height of the single-power-supply cell.

With this configuration, a larger area of the N-well region of the plural-power-supply cell can be secured than in the case where the plural-power-supply cell has the same height as the single-power-supply cell. Thus, the circuit can be laid out easily in spite of the coexistence of the single-power-supply cell and the plural-power-supply cell in the circuit (FIGS. 10, 11).

According to a 13th aspect of the invention, in the method of wiring power supplies, a power strap wiring is prepared using a first wiring layer and the second power line of the plural-power-supply cell and the power strap wiring are connected to each other using a second wiring layer.

With this configuration, even in the case where a single-power-supply cell and a plural-power-supply cell are existent within the same row, the power supply of the second power line can be wired by connecting the second power line of the plural-power-supply cell to the power strap wiring (FIGS. 20).

According to a 14th aspect of the invention, in the method of wiring power supplies, a plurality of power strap wirings are prepared using the first wiring layer, and the second power line of the plural-power-supply cell and the plurality of power strap wirings are connected to each other using the second wiring layer, the keyword being "a plurality of the power strap wirings".

With this configuration, even in the case where a single-power-supply cell and a plural-power-supply cell are existent within the same row, the power supply of the second power line can be wired by connecting the second power line of the plural-power-supply cell to a plurality of the power strap wirings. In view of the fact that the second power line of the plural-power-supply cell is connected to a plurality of the power strap wirings, the source voltage drop of the second power line can be suppressed by reducing the wiring resistance of the second power line (FIG. 21).

According to a 15th aspect of the invention, in the method of wiring power supplies, a power strap wiring is prepared using a first wiring layer, and a partial wiring connected with the second power lines of a plurality of the plural-power-supply cells is connected to the power strap wiring using a second wiring layer, the keyword being "the partial wiring".

With this configuration, the second power lines of the plural-power-supply cells existent in different rows can be formed into a single wiring (partial wiring) and connected to the power strap wiring. Thus, the second power lines can be wired with small wiring resources (FIG. 22).

According to a 16th aspect of the invention, in the method of wiring power supplies, a plurality of power strap wirings are prepared using the first wiring layer, and a partial wiring connected with the second power lines of a plurality of the plural-power-supply cells is connected to a plurality of the power strap wirings using the second wiring layer, the keywords being "a plurality of the power strap wirings and the partial wiring".

With this configuration, the second power lines of the plural-power-supply cells existing in different rows can be connected to the power strap wiring collectively into a single wiring (partial wiring). As a result, the second power lines can be wired with small wiring resources. Also, in view of the fact that the second power lines are connected with a plurality of the power strap wirings, the source voltage drop of the second power lines can be suppressed by reducing the wiring resistance of the second power lines.

According to a 17th aspect of the invention, in the method of wiring power supplies, the power strap wiring is arranged in such a manner that the shortest distance from the power strap wiring to the plural-power-supply cell is not more than a predetermined value after arranging the plural-power-supply cell, the keywords being "after arranging the plural-power-supply cell" and "the shortest distance".

With this configuration, the shortest distance from the power strap wiring to the plural-power-supply cell can be controlled, so that the source voltage drop of the second power line can be suppressed by reducing the wiring resistance of the second power line (FIGS. 23, 24).

According to an 18th aspect of the invention, in the method of wiring power supplies, the power strap wiring is arranged in such a manner that the resistance value from the power strap wiring to the plural-power-supply cell is not more than a predetermined value after arranging the plural-power-supply cell, the keywords being "after arranging the plural-power-supply cell" and "the resistance value".

With this configuration, the resistance value of the wiring from the power strap wiring to the plural-power-supply cell can be controlled, so that the source voltage drop of the second power line can be suppressed by reducing the wiring resistance of the second power line (FIGS. 23, 24).

According to a 19th aspect of the invention, in the method of wiring power supplies, the power strap wiring is arranged in such a manner that the source voltage drop value from the power strap wiring to the plural-power-supply cell is not more than a predetermined value after arranging the plural-power-supply cell, the keywords being "after arranging the plural-power-supply cell" and "the source voltage drop value".

With this configuration, the source voltage drop value from the power strap wiring to the plural-power-supply cell can be controlled so that the source voltage drop across the second power line can be suppressed (FIGS. 23, 24).

According to a 20th aspect of the invention, in the method of wiring power supplies, the plural-power-supply cell is arranged in such a manner that the shortest distance from the power strap wiring to the plural-power-supply cell is not more than a predetermined value after arranging the power strap wiring, the keywords being "after arranging the power strap wiring" and "the shortest distance".

With this configuration, the shortest distance from the power strap wiring to the plural-power-supply cell can be decreased, so that the source voltage drop of the second power line can be suppressed by reducing the wiring resistance of the second power line (FIGS. 25, 26).

According to a 21st aspect of the invention, in the method of wiring power supplies, the plural-power-supply cell is arranged in such a manner that the resistance value from the power strap wiring to the plural-power-supply cell is not more than a predetermined value after arranging the power strap wiring, the keywords being "after arranging the power strap wiring" and "the resistance value".

With this configuration, the resistance value of the wiring from the power strap wiring to the plural-power-supply cell can be controlled, so that the source voltage drop of the second power line can be suppressed by reducing the wiring resistance of the second power line (FIGS. 25, 26).

According to a 22nd aspect of the invention, in the method of wiring power supplies, the plural-power-supply cell is arranged in such a manner that the source voltage drop value from the power strap wiring to the plural-power-supply cell is not more than a predetermined value after arranging the power strap wiring, the keywords being "after arranging the power strap wiring" and "the source voltage drop value".

With this configuration, the source voltage drop value from the power strap wiring to the plural-power-supply cell can be controlled thereby to suppress the source voltage drop of the second power line (FIGS. 25, 26).

According to a 23rd aspect of the invention, in the semiconductor integrated device, the plural-power-supply cell is used for the clock tree portion.

With this configuration, the source voltage of the clock tree portion can be changed by changing the source potential applied to the second power line (FIG. 27).

According to a 24th aspect of the invention, in the semiconductor integrated device, the plural-power-supply cell is used for the clock tree portion, and the potential of the second power line of the plural-power-supply cell is decreased below the potential of the first power line.

With this configuration, the source voltage of the cell of the clock tree portion can be changed, so that the power consumption of the clock tree can be reduced by decreasing the source voltage of the clock tree portion (FIG. 27).

According to a 25th aspect of the invention, in the semiconductor integrated device, the clock tree portion is connected to a latch, and the last stage of the clock tree portion makes up a pulse generating circuit.

With this configuration, the source voltage of the cell of the clock tree portion can be changed, so that the power consumption of the clock tree can be reduced by decreasing the source voltage of the clock tree portion. Also, the power consumption of the block as a whole can be further reduced by a flip-flop made up of a pulse generating circuit and a latch (FIG. 28).

According to a 26th aspect of the invention, in the semiconductor integrated device, the plural-power-supply cell is used for a circuit element string portion deficient of the operating speed.

With this configuration, the source voltage of the circuit element string portion deficient of the operating speed can be changed by changing the source potential supplied to the second power line.

According to a 27th aspect of the invention, in the semiconductor integrated device, the plural-power-supply cell is used for a circuit element string portion deficient of the operating speed, and the potential of the second power line of the plural-power-supply cell is increased beyond the potential of the first power line.

With this configuration, the source voltage of the circuit element string portion deficient of the operating speed can be changed, so that the operating speed of the circuit element string can be increased by increasing the source voltage of the circuit element string (FIG. 32).

According to a 28th aspect of the invention, in the semiconductor integrated device, the plural-power-supply cell is used for the circuit element string portion having a margin of the operating speed.

With this configuration, the source voltage of the circuit element string portion having a margin of the operating speed can be changed by changing the source potential applied to the second power line.

According to a 29th aspect of the invention, in the semiconductor integrated device, the plural-power-supply cell is used for the circuit element string portion having a margin of the operating speed, and the potential of the second power line of the plural-power-supply cell is reduced below the potential of the first power line.

With this configuration, the source voltage of the circuit element portion having a margin of the operating speed can be changed. Also, the power consumption of the circuit element string can be reduced by decreasing the source voltage of the circuit element portion having a margin of the operating speed.

According to a 30th aspect of the invention, the semiconductor integrated device comprises a first cell having a large peak current and a second cell having a small peak current, and the plural-power-supply cell is used as the cell having a large peak current.

With this configuration, the propagation of the power noises due to the cell having a large peak current to the cell having a small peak current can be suppressed.

The foregoing and other aspects will become apparent from the following description of the invention when considered in conjunction with the accompanying drawing figures.

BRIEF DESCRIPTION OF THE DRAWINGS

In all these figures, like components are indicated by the same numerals.

DESCRIPTION OF THE PREFERRED EMBODIMENTS

Preferred embodiments of the invention will be explained below with reference to the accompanying drawings.

Figure 1:
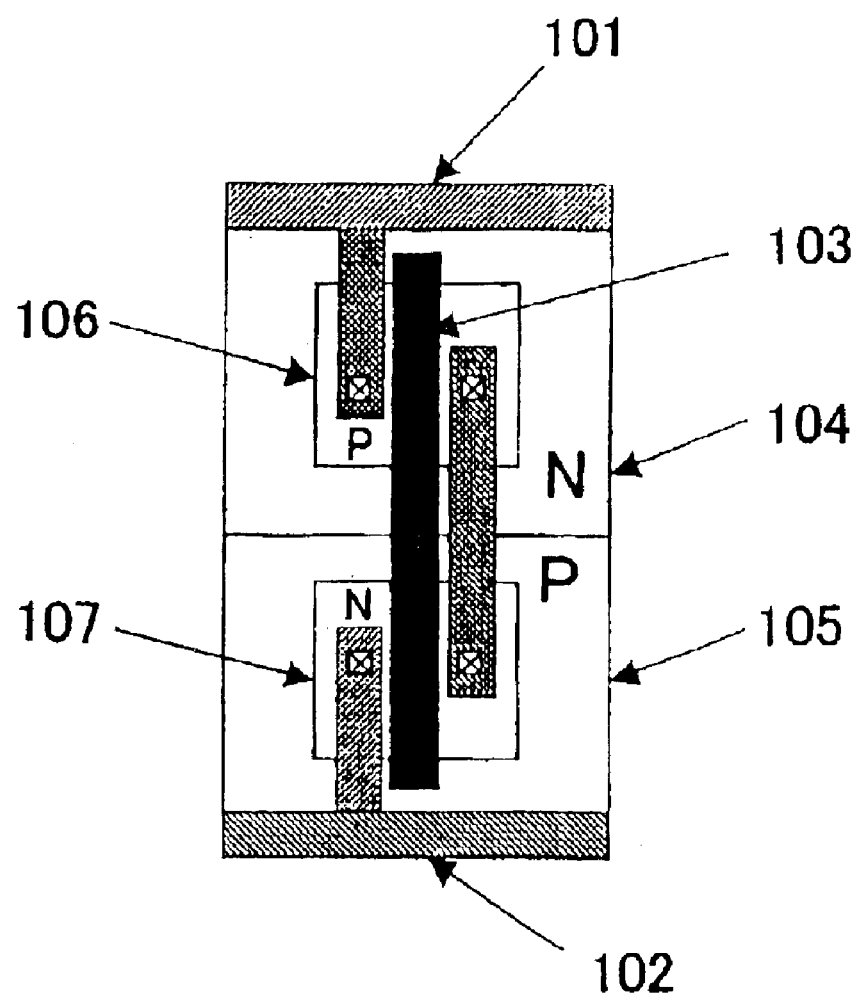
FIG. 1 is a circuit diagram showing a standard cell according to the prior art.
Figure 2A:
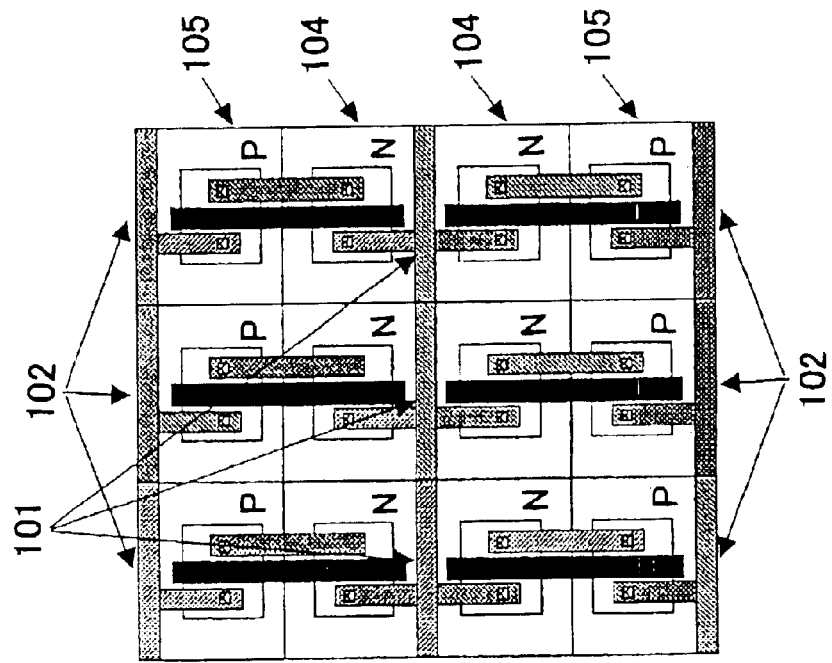
FIGS. 2A and 2B are block layout diagrams using the standard cell according to the prior art.
Figure 2B:
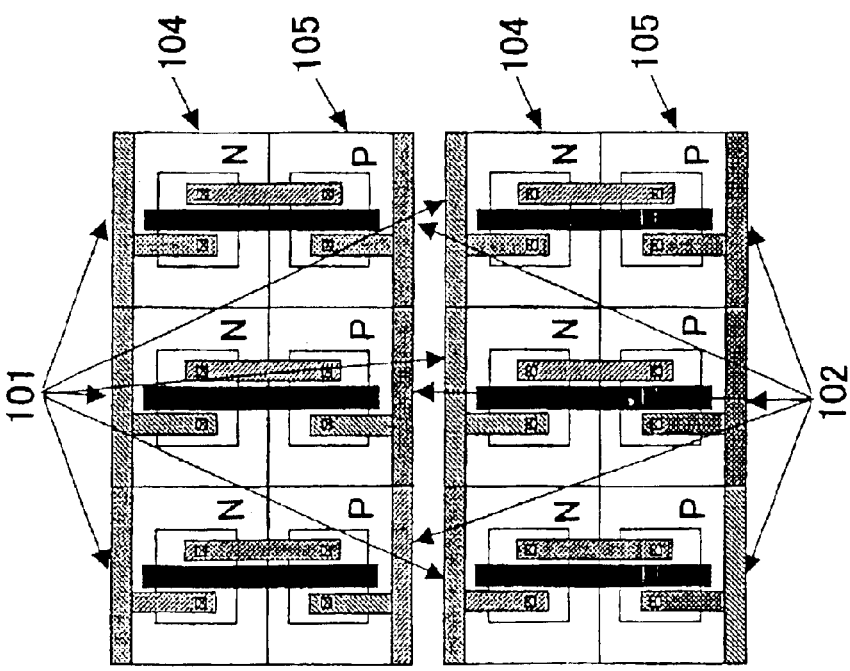
Figure 3:
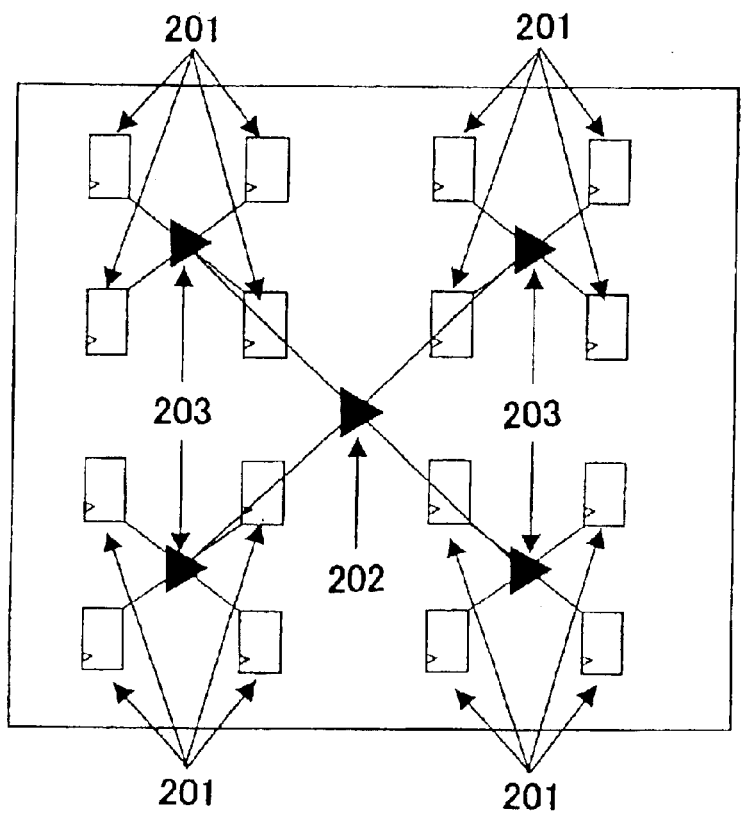
FIG. 3 is a diagram showing a layout of a clock tree portion according to the prior art.
Figure 4:
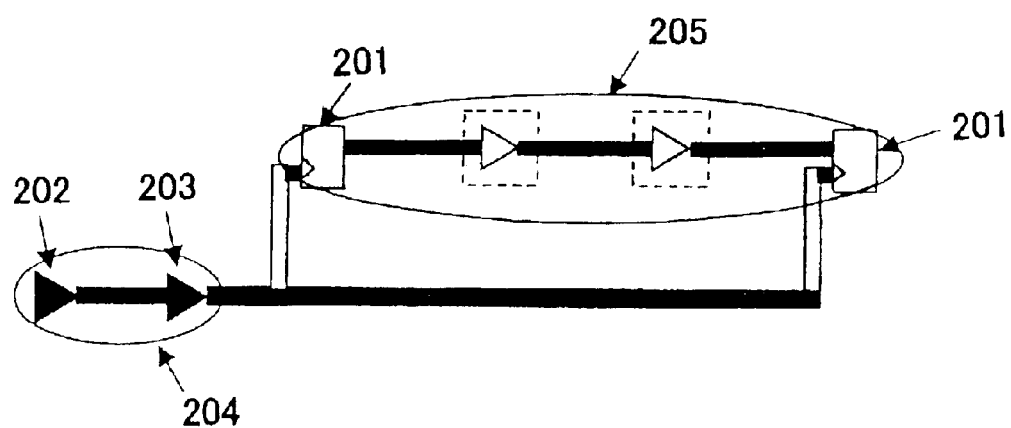
FIG. 4 is a circuit diagram of a circuit element string according to the prior art.
Figure 5:
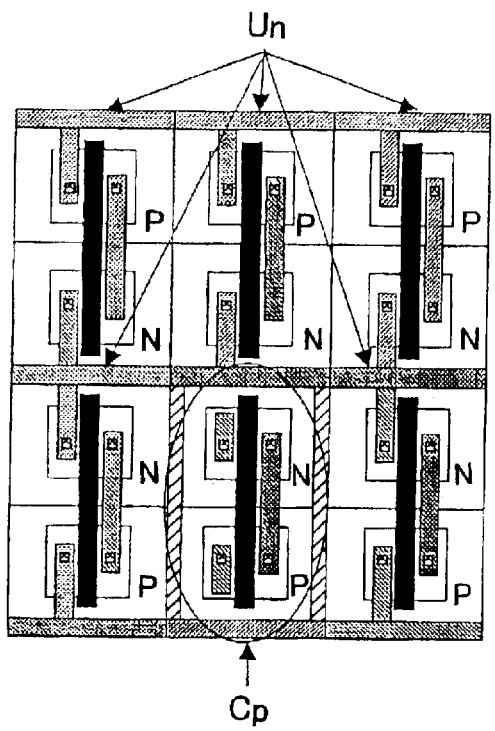
FIG. 5 shows a diagram showing a layout of a virtual block using a plural-power-supply cell and single-power-supply cells according to the prior art.
Figure 6:
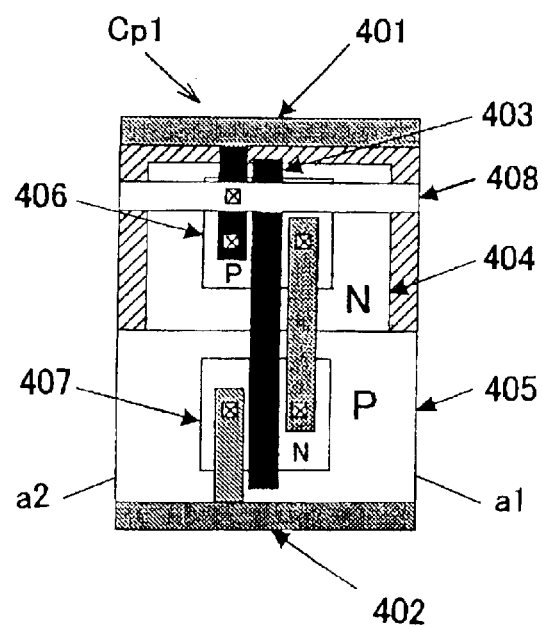
FIG. 6 is a circuit diagram showing a plural-power-supply cell according to this invention.

A standard cell Cp1 for a plurality of power supplies (hereinafter referred to as the plural-power-supply cell Cp1) shown in FIG. 6 is configured of a first power line 401, a grounding line 402, a transistor gate 403, an N well 404, a P well 405, a P-channel diffusion region 406, an N-channel diffusion region 407 and a second power line 408. The first power line 401 and the second power line 408 are electrically isolated from each other. The second power line 408 and the N well 404 are electrically connected with each other, and so are the grounding line 402 and the P well 405. The first power line 401 and the second power line 408 are arranged in the wiring layers of different heights in the cell. As emphatically indicated by hatching, the N well 404 is arranged in spaced relation with the whole peripheral boundaries (all of the upper, lower, right and left boundaries). The P well 405 is in contact with the boundaries a1, a2 on both sides in the direction along the power lines of the cell (along the power-line direction). The first power line 401, the second power line 408 and the grounding line 402 are formed in contact with the two boundaries a1, a2.

Figure 7:
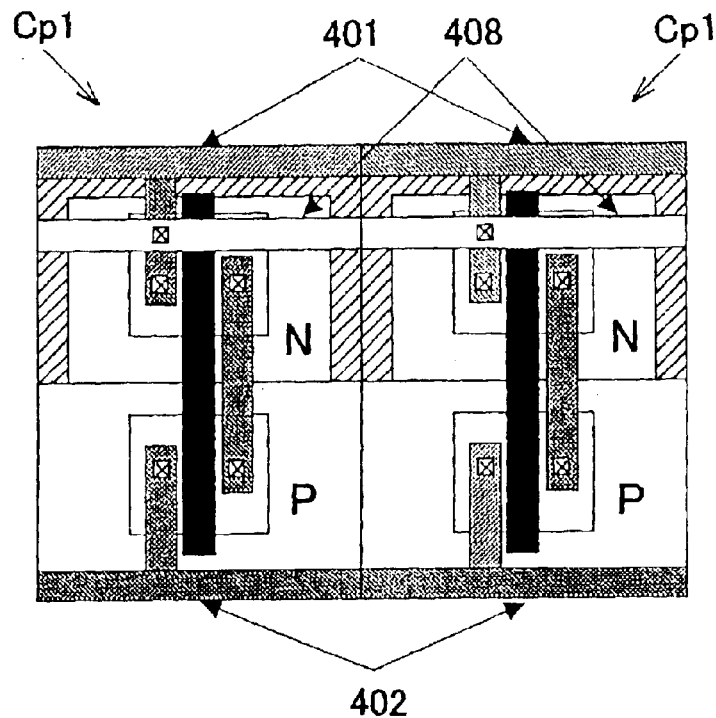
FIG. 7 is a diagram showing a block layout using plural-power-supply cells according to this invention.

As shown in FIG. 7, the adjacent arrangement of two plural-power-supply cells Cp1 brings each pair of the first power lines 401, the grounding lines 402 and the second power lines 408 into contact with each other. Thus, a series of power wires are formed.

Figure 8:
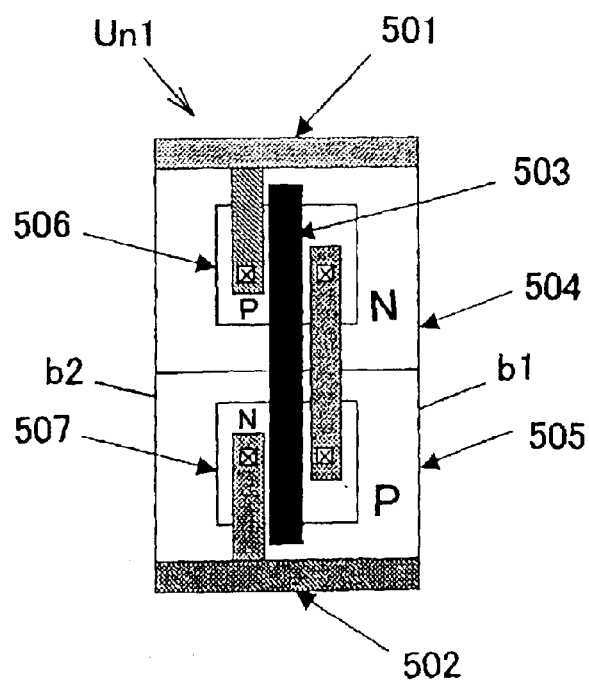
FIG. 8 is a circuit diagram showing a single-power-supply cell according to this invention.

As shown in FIG. 8, a single-power-supply cell Un1 is configured of a power line 501, a grounding line 502, a transistor gate 503, an N well 504, a P well 505, a P-channel diffusion region 506 and an N-channel diffusion region 507. The power line 501 and the N well 504 are electrically connected to each other, and so are the grounding line 502 and the P well 505. The N well 504 and the P well 505 are in contact with the boundaries b1, b2 on the two sides along the power line. The power line 501 and the grounding line 402 are formed in contact with the two boundaries b1, b2.

Figure 9:
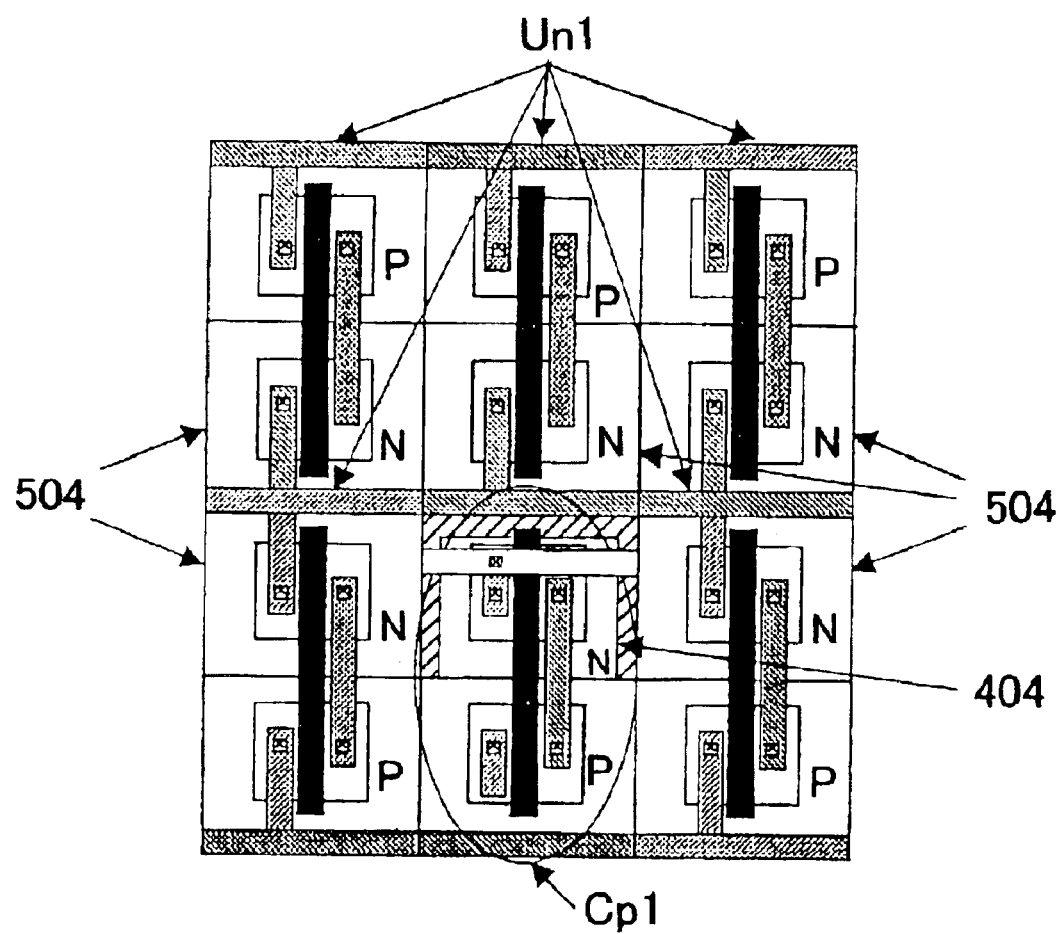
FIG. 9 is a diagram showing a block layout using a plural-power-supply cell and single-power-supply cells according to the invention.

As shown in FIG. 9, in the case where a plurality of the single-power-supply cells Un1 and a plural-power-supply cell Cp1 are arranged in the same block, the single-power-supply cells Un1 in the upper row and the single-power-supply cells Un1 in the lower row are arranged in opposite directions to each other, so that the N wells 504 in the upper and lower rows are in contact with each other.

The N well 404 of the plural-power-supply cell Cp1 at the center of the lower row is arranged in spaced relation with the whole peripheral boundaries (all of the upper, lower, left and right boundaries) of the cell, as emphatically indicated by hatching. Even in the case where adjacent cells are arranged in contact with each other in the direction along the power lines or the direction orthogonal thereto, therefore, the N well 404 of the plural-power-supply cell Cp1 can be kept isolated from the N wells 504 of the single-power-supply cells Un1. The N well of the plural-power-supply cell Cp1 shown in FIG. 9 is thus isolated from the N wells of left and right single-power-supply cells Un1 and the upper single-power-supply cell Un1. As a result, the area of the block can be decreased by keeping the cells in the upper and lower rows in contact with each other.

Figure 10:
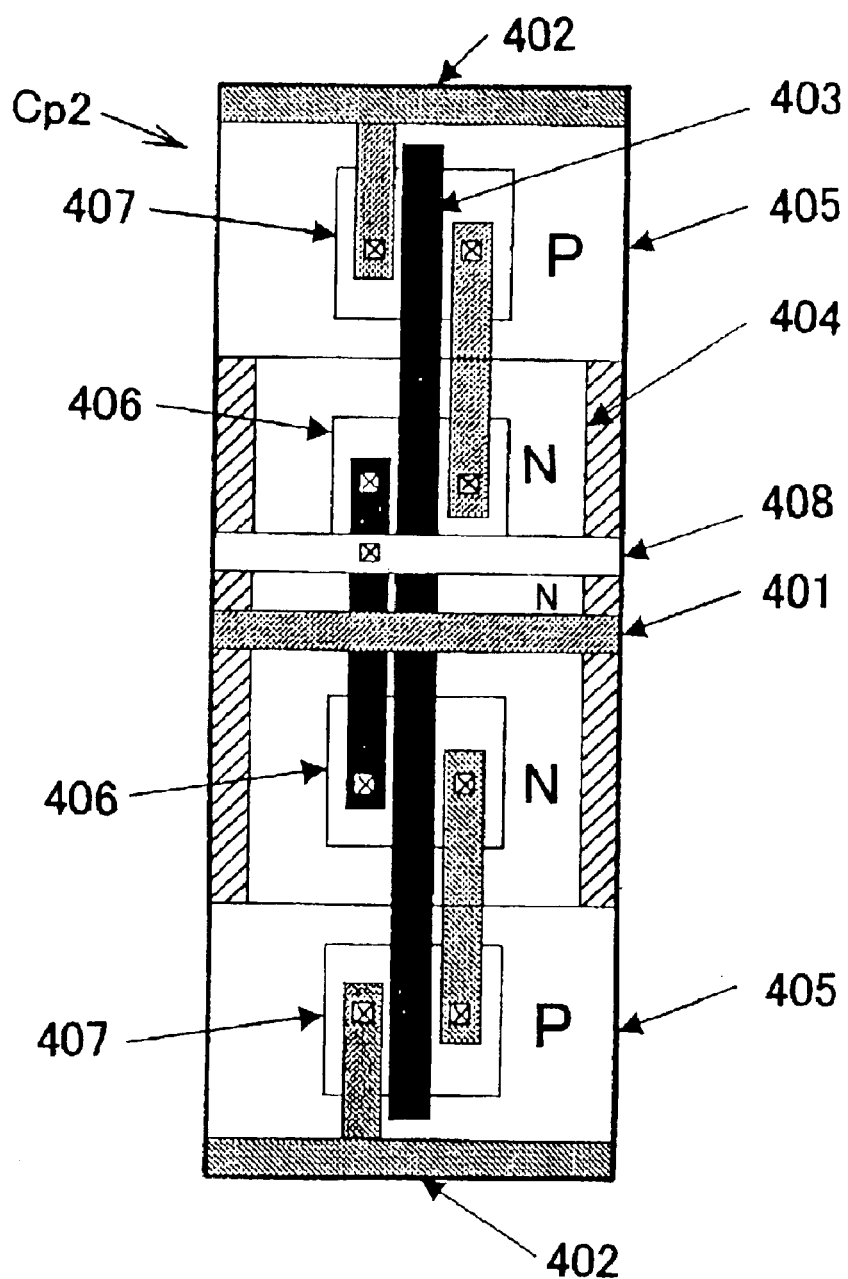
FIG. 10 is a circuit diagram of a plural-power-supply cell having a double height according to this invention.

A plural-power-supply cell Cp2 shown in FIG. 10, which is twice as tall as the single-power-supply cell, is equivalent to two plural-power-supply cells Cp1 shown in FIG. 6 which are arranged in contact with each other in opposite directions orthogonal to the two power lines in such a manner that the N wells 404 are in contact with each other. However, only one first power line 401 and only one second power line 408 are involved. The hatching indicates the areas separating the N wells 404 and the cell boundaries from each other.

As a result, the area of the N wells can be increased. Specifically, a larger area of the substrate contact can be secured on the N wells for a strengthened latch up.

Figure 11:
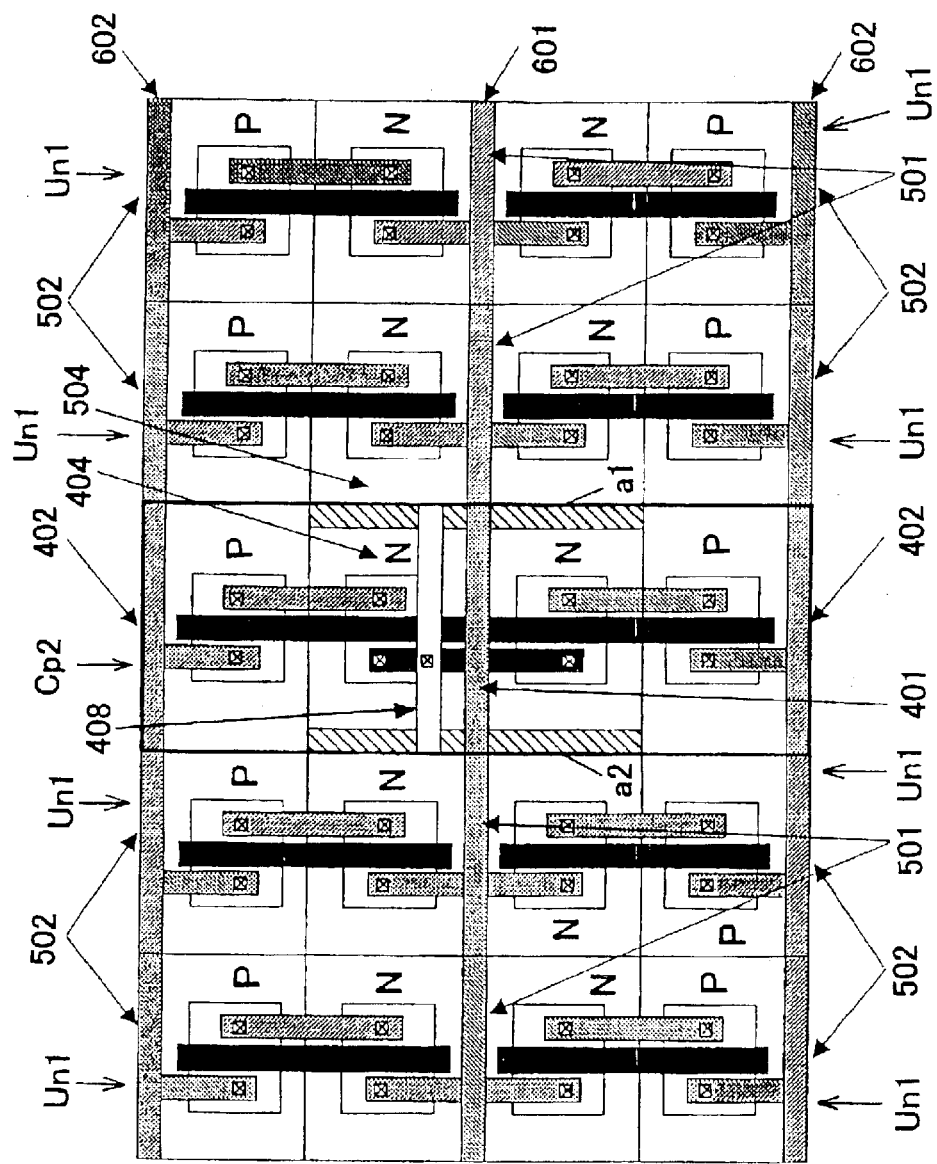
FIG. 11 is a diagram showing a block layout using plural-power-supply cells and single-power-supply cells according to this invention.

As shown in FIG. 11, assume that a plural-power-supply cell Cp2 twice as high and single-power-supply cells Un1 are used in the same block. The single-power-supply cells Un1 in the upper and lower rows are arranged in opposite directions in such a manner that the N wells thereof are in contact with each other. The plural-power-supply cell Cp2 and the single-power-supply cells Un1 are arranged so that the first power line 401 of the plural-power-supply cell Cp2 is in contact with the first power lines 501 of the single-power-supply cells Un1, thereby forming a first series of power lines 601. By arranging the grounding line 402 of the plural-power-supply cell Cp2 and the grounding lines 502 of the single-power-supply cells Un1 in contact with each other, on the other hand, a series of the grounding lines 602 are formed.

As emphasized by hatching, the N well 404 of the plural-power-supply cell Cp2 is arranged in spaced relation with the cell boundaries a1, a2. The N well 404 of the plural-power-supply cell Cp2 is kept out of contact with the N wells 504 of the single-power-supply cells Un1 arranged adjacently with each other. The N wells 504 of the single-power-supply cells Un1 are connected to the first power line 401, and the N well 404 of the plural-power-supply cell Cp2 are connected to the second power line 408. These N wells, which have different source potentials, are electrically isolated from each other completely.

Figure 12:
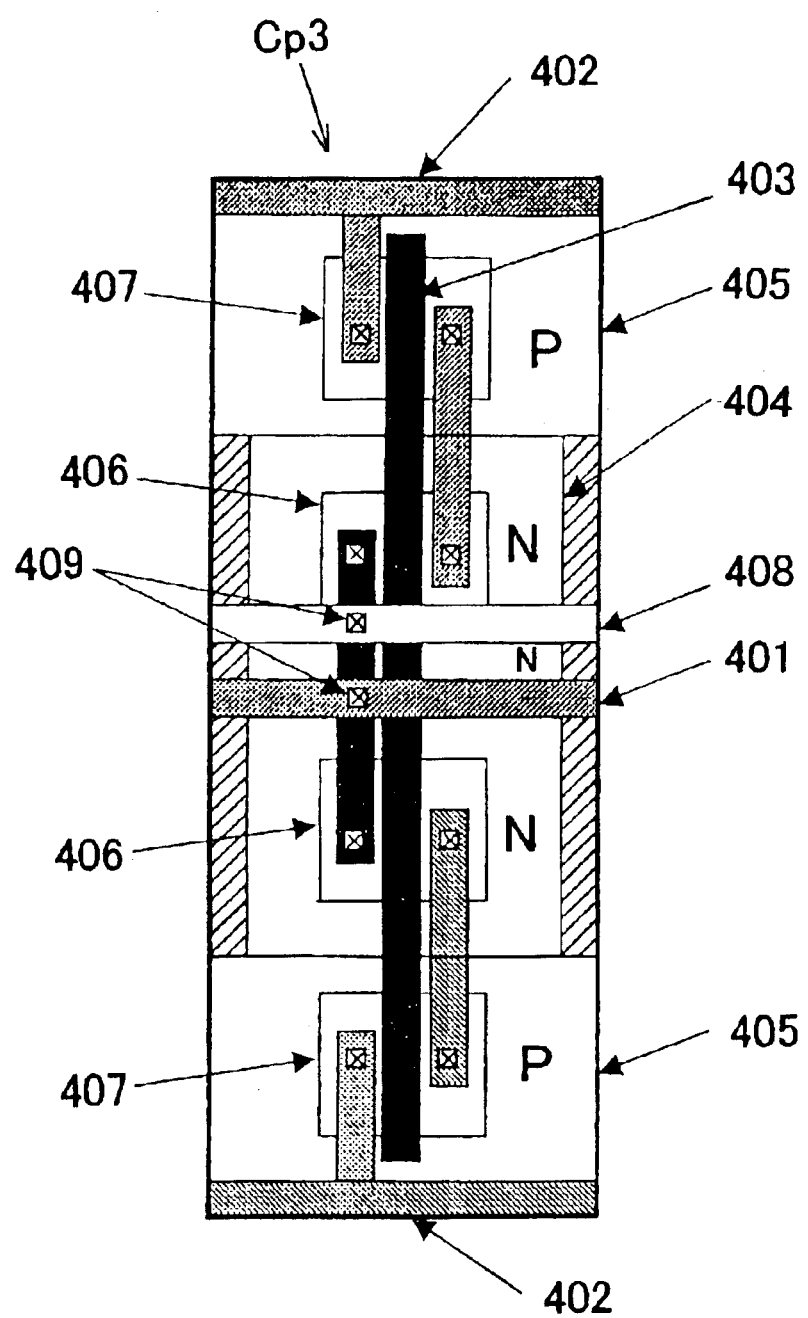
FIG. 12 is a circuit diagram showing a plural-power-supply cell with the source potential switchable according to the invention.

A plural-power-supply cell Cp3 shown in FIG. 12 can be switched between the first power line 401 and the second power line 408 for supplying power. The N well 404 is electrically isolated from the first power line 401 and the second power line 408. In the wiring step, a power supply-connecting contact 409 is arranged on one of the first power line 401 and the second power line 408. In this way, the N well 404 is electrically connected selectively with the first power line 401 or the second power line 408. As a result, the power supply for the plural-power-supply cell Cp3 can be switched between the first power line and the second power line.

Figure 13:
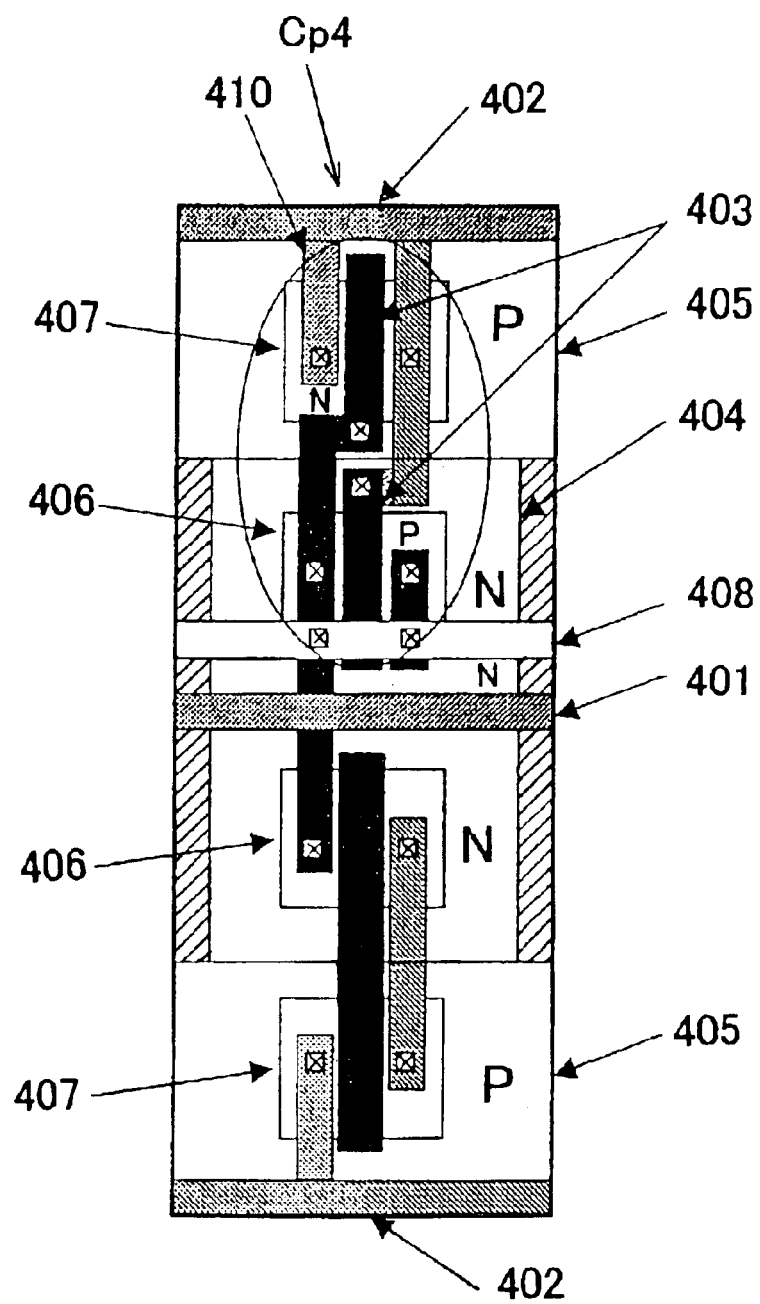
FIG. 13 is a circuit diagram showing a plural-power-supply cell having a decoupling capacitor according to the invention.

A plural-power-supply cell Cp4 shown in FIG. 13 includes a decoupling capacitor 410 utilizing the gate oxide film capacity of the transistor. The decoupling capacitor 410 is such that the grounding line 402 is connected to the source and the drain of the transistor and the second power line 408 to the gate of the transistor in the N-channel diffusion region 407. In the P-channel diffusion region 406, on the other hand, the second power line 408 is connected to the source and the drain of the transistor, and the grounding line 402 to the gate 403 of the transistor.

The decoupling capacitor 410 can suppress the power noises of the second power line 408. Incidentally, a larger wiring area can be secured by arranging the decoupling capacitor 410 separately from the logic circuit area of the plural-power-supply cell. In FIG. 13, the decoupling capacitor is arranged in the upper half portion, while the logic circuit in the lower half portion. As a result, a signal line covering the upper and lower portions need not be wired in the plural-power-supply cell Cp4, thereby making it possible to secure a larger wiring area.

Figure 14:
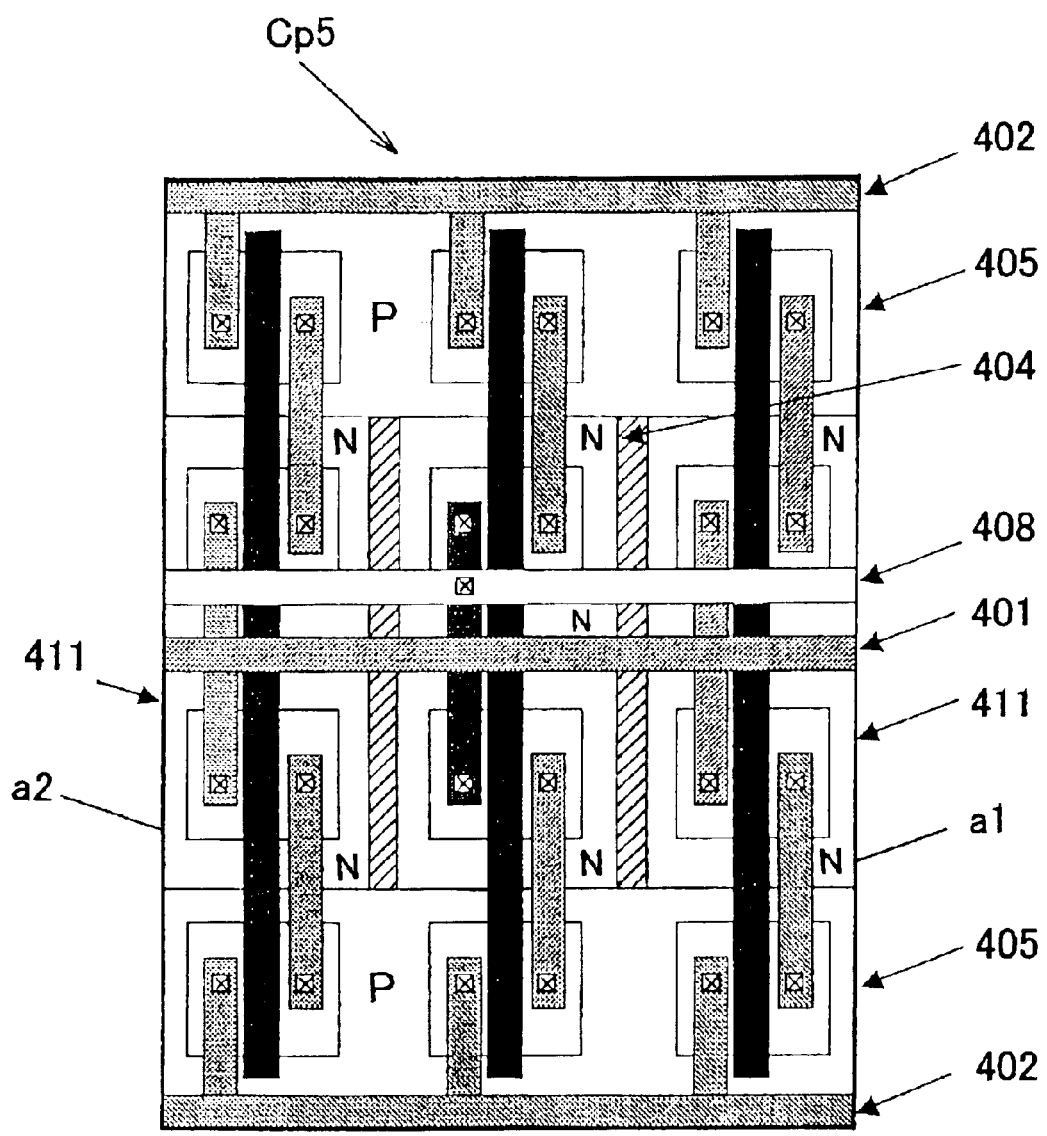
FIG. 14 is a circuit diagram showing plural-power-supply cells having a second N well according to the invention.

A plural-power-supply cell Cp5 shown in FIG. 14 includes N wells 411 on both ends along the direction of the power line. The plural-power-supply cell Cp5 has three layers of a transistor-forming area. Two N wells 411 in contact with the boundaries a1, a2 are formed on both sides of an independently isolated central N well 404. The central N well 404 and the two N wells 411 on both sides are isolated electrically from each other as indicated emphatically by hatching. The central N well 404 is in contact with the second power line 408. The N wells 411 on both sides are electrically connected with the first power line 401. Thus, the plural-power-supply cell Cp5 has therein two circuits of different source voltages. A P well 405 covers three transistor-forming areas.

Figure 15:
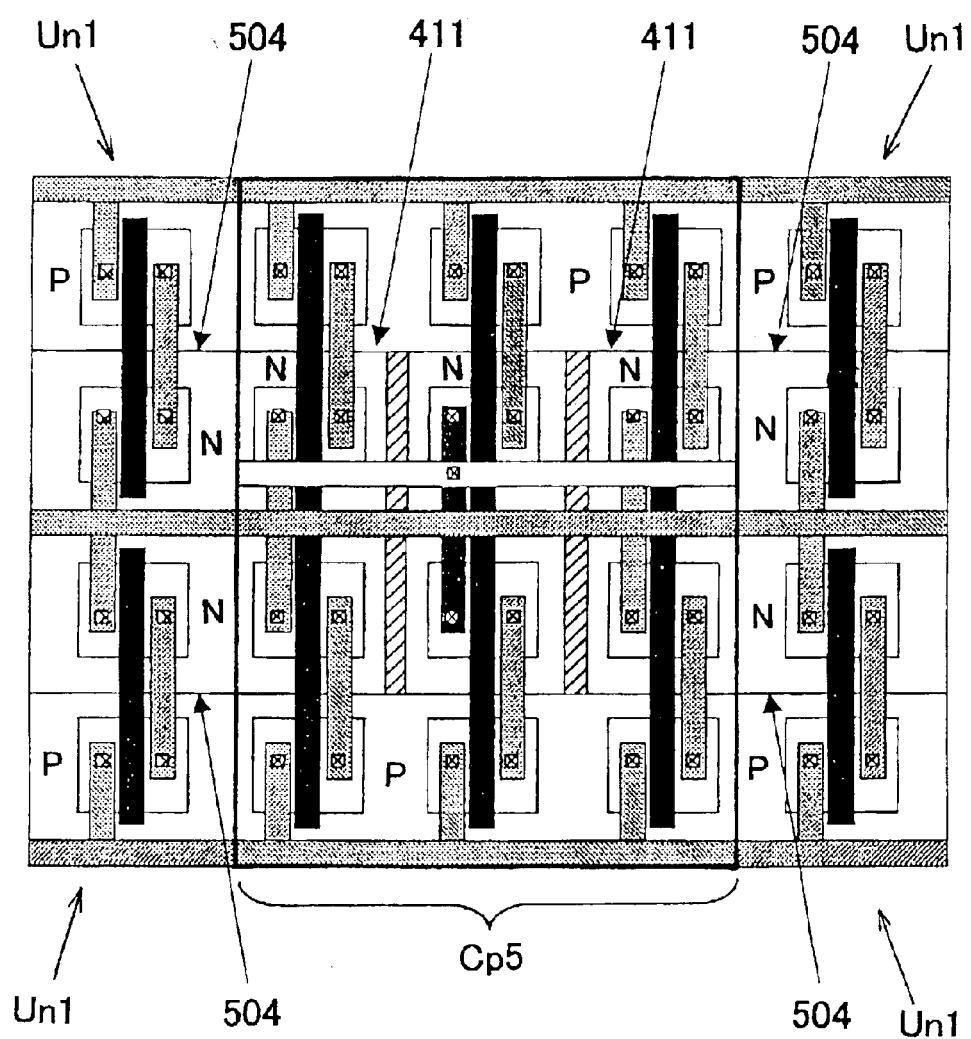
FIG. 15 is a diagram showing a block layout of plural-power-supply cells having a second N well according to the invention.

FIG. 15 shows a case in which the plural-power-supply cells Cp5 and the single-power-supply cells Un1 of FIG. 14 are used in the same block. The N wells 504 of the single-power-supply cells Un1 are in contact with the N wells 411 on both sides of the plural-power-supply cells Cp5, and therefore the area of the N wells 504 of the single-power-supply cells Un1 can be increased for a higher latch-up strength.

Though not shown, even in the case where the single-power-supply cells Un1 are arranged between the plural-power-supply cells Cp5, the latch-up strength can be increased by increasing the area of the N wells 504 of the single-power-supply cells Un1.

Also, in the case where the plural-power-supply cells Cp2 are arranged adjacently to each other, the central N wells 404 are isolated cell by cell, whereas the N wells 411 on both sides, of which adjacent ones are in contact with each other at the same potential, can be formed into a single well.

Figure 16:
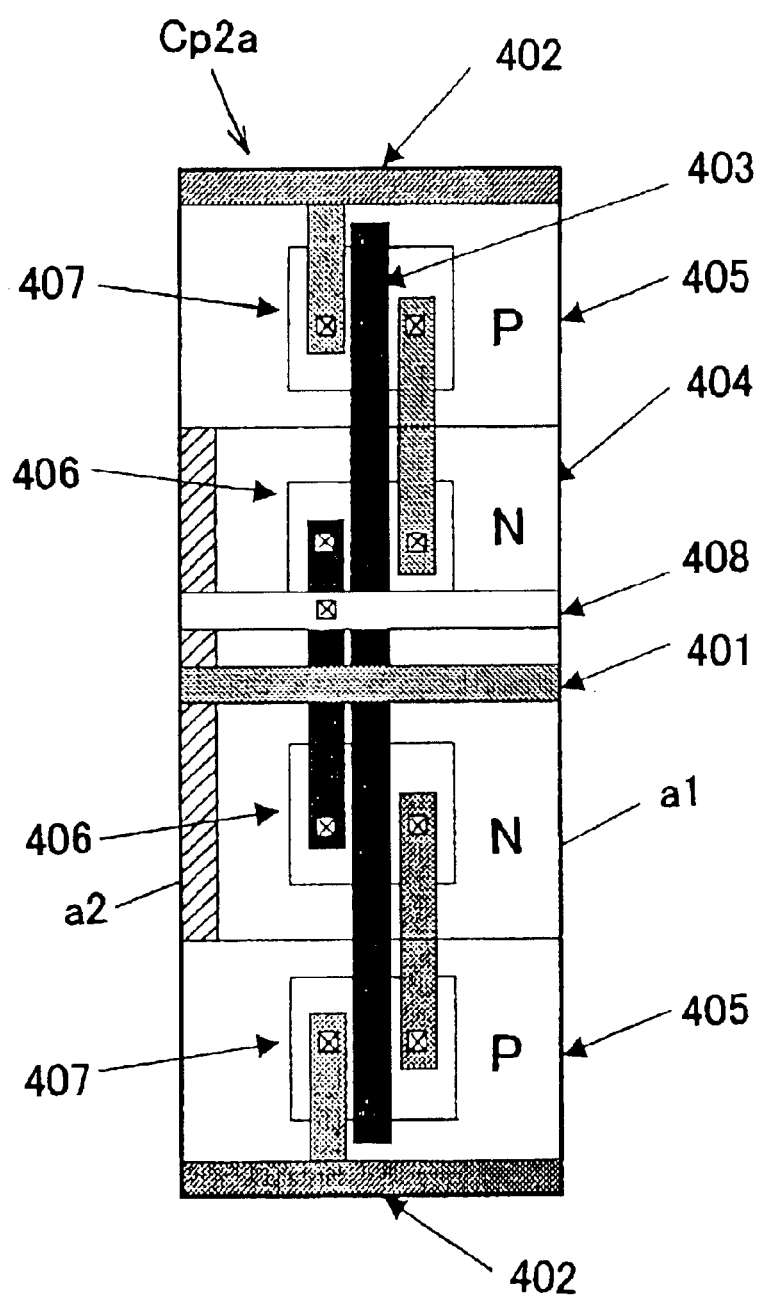
FIG. 16 is a circuit diagram showing a plural-power-supply cell having N wells in contact with the cell boundary according to the invention.
Figure 17:
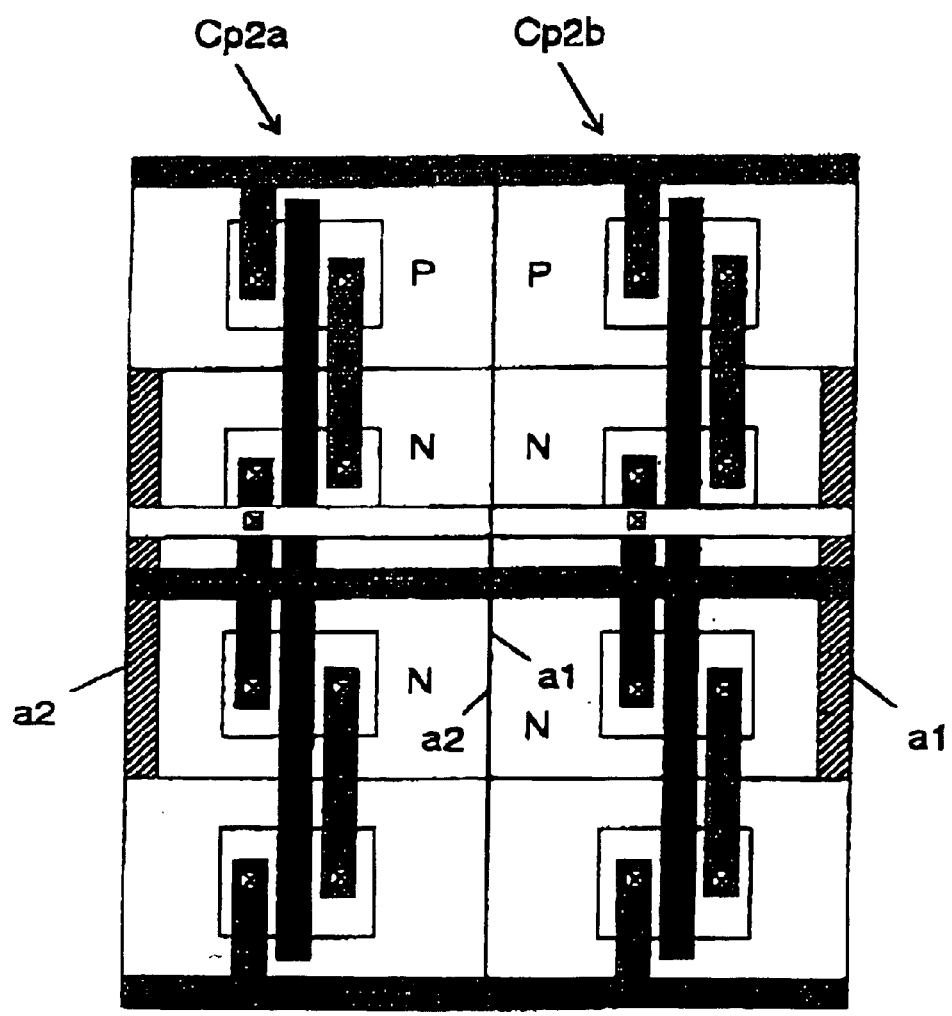
FIGS. 17(a) and 17(b) are process diagrams showing a block layout of plural-power-supply cells having N wells in contact with the cell boundary according to the invention and FIG. 17(b) is a diagram showing a block layout of plural-power-supply cells Cp2c having N wells in contact with the cell boundaries a1 and a2 according to the invention.
Figure 17:
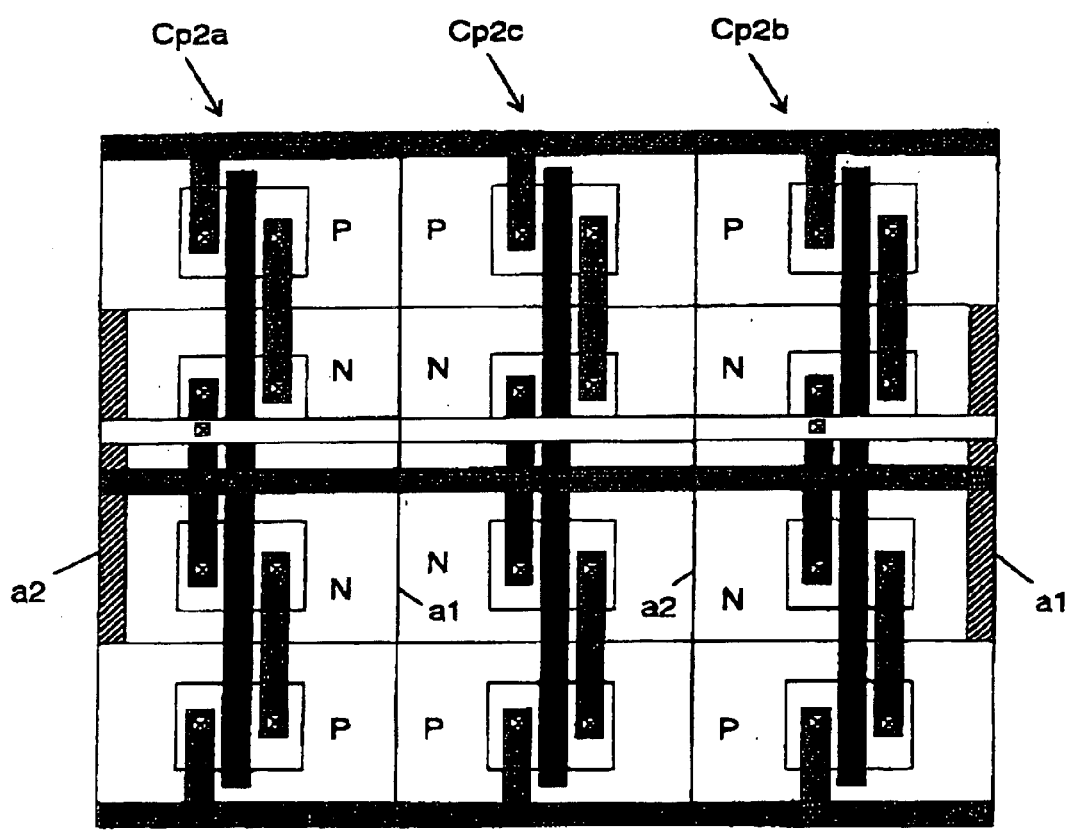

A plural-power-supply cell Cp2a shown in FIGS. 16 and 17(a) and 17(b) corresponds to a case in which the N well 404 of the plural-power-supply cell Cp2 of FIG. 10 is formed in contact with the extreme right boundary a1 of the cell.

A plural-power-supply cell Cp2b shown in FIG. 17(a) corresponds to a case in which the N well 404 of the plural-power-supply cell Cp2 of FIG. 10 is formed in contact with the extreme left boundary a2 of the cell.

As shown in FIG. 17(a), in the case where the plural-power-supply cell Cp2a and the plural-power-supply cell Cp2b are arranged adjacently to each other, the plural-power-supply cell Cp2a of which the N well 404 is in contact with the extreme right boundary a1 is arranged on the left side, and the plural-power-supply cell Cp2b of which the N well 404 is in contact with the extreme left boundary a2 is arranged on the right side, thereby bringing the N wells 404 into contact with each other. As a result, a single large N well can be formed for an increased latch-up strength.

A plural-power-supply cell Cp2c is prepared by being formed in such a manner that the N wells 404 of the plural-power-supply cell Cp2 shown in FIG. 10 are in contact with the boundaries a1, a2 on the left and right sides, respectively. As shown in FIG. 17(b), the plural-power-supply cell Cp2c is inserted between the left plural-power-supply cell Cp2a and the right plural-power-supply cell Cp2b. The N well of the central plural-power-supply cell Cp2c thus inserted is in contact with the left and right boundaries a1, a2, respectively. Therefore, the N well 404 of the plural-power-supply Cp2c is in contact with both the N well 404 of the plural-power-supply cell Cp2a on the left side and the N well 404 of the plural-power-supply cell Cp2b on the right side. In this way, a single large N well can be formed to increase the latch-up strength.

In FIG. 17(b), assume that a plurality of the plural-power-supply cells Cp2c are inserted in alignment between the left plural-power-supply cell Cp2a and the right plural-power-supply cell Cp2b. All the N wells 404 are brought into contact thereby to form a single sufficiently large N well for a further strengthened latch-up.

Figure 18:
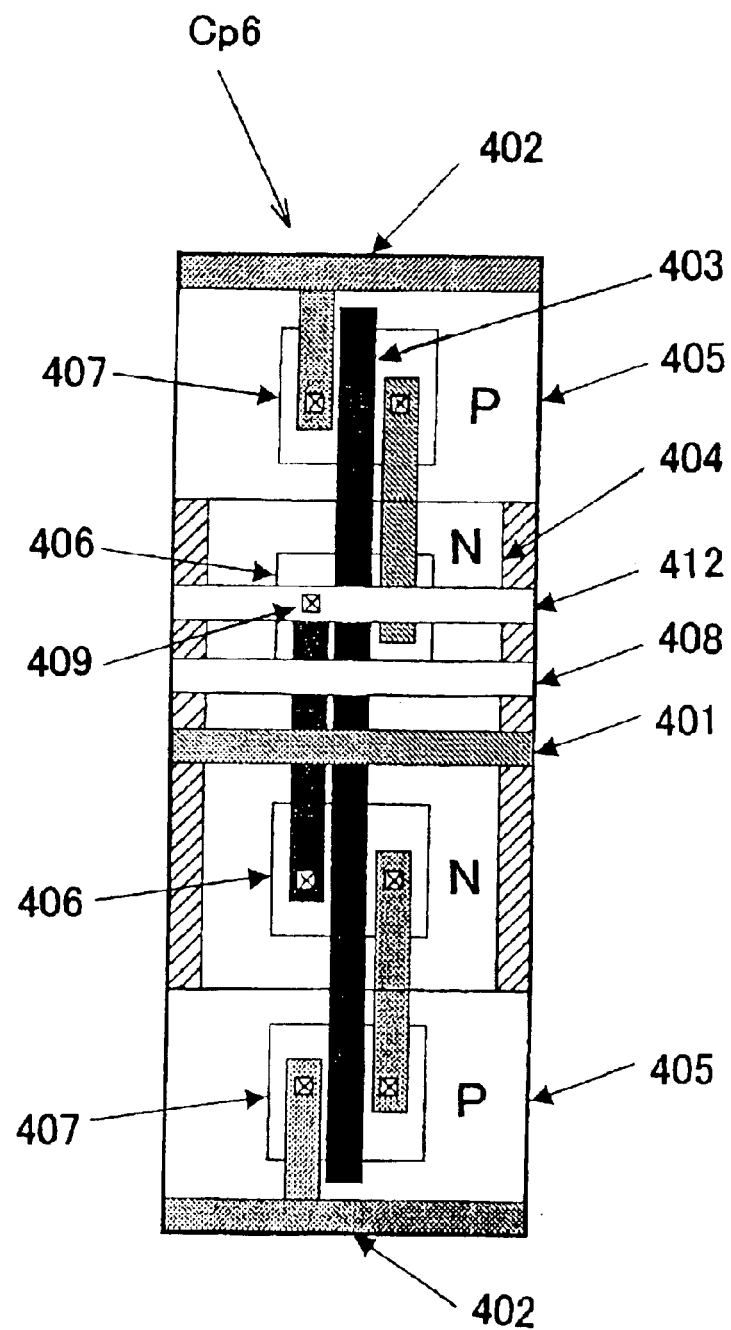
FIG. 18 is a circuit diagram showing a plural-power-supply cell having a third power line according to the invention.

A plural-power-supply cell Cp6 shown in FIG. 18, on the other hand, includes a third power line 412 in addition to the first power line 401 and the second power line 408, and is so formed that the wiring height of the third power line 412 is different from those of the first power line 401 and the second power line 408.

The N well 404 is electrically isolated from the first power line 401, the second power line 408 and the third power line 412. In the wiring process, one of the first power line 401, the second power line 408 and the third power line 412 is connected with the N well 404 through a contact 409. As a result, the power supply for the plural-power-supply cell Cp6 can be switched between the three power lines.

Figure 19:
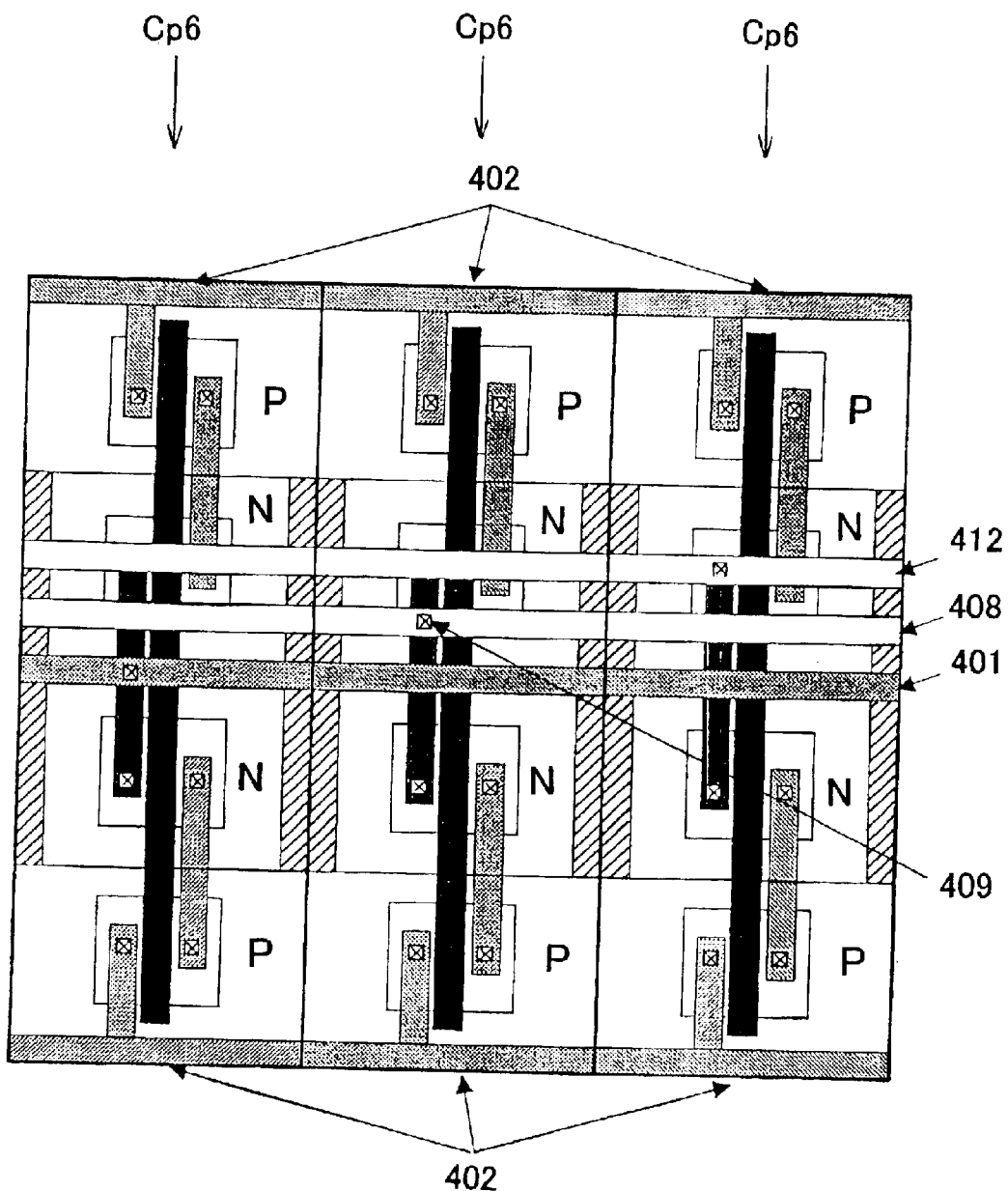
FIG. 19 is a diagram showing a block layout using plural-power-supply cells having the third power line according to the invention.

As shown in FIG. 19, three power supplies may be used. The plural-power-supply cell Cp6 on the extreme left side is supplied with power from the first power line 401, the central plural-power-supply cell Cp6 from the second power line 408, and the plural-power-supply cell Cp6 on the extreme right side from the third power line 412. The first power line 401, the second power line 408 and the third power line 412 have different wiring heights. Even in the case where cells of three different source voltages are existent in the same row, therefore, the power supplies can be connected without any problem.

Apart from FIG. 6 showing a case in which the N well 404 is arranged in spaced relation with the whole peripheral boundaries, the P well 405 instead of the N well 404 may be arranged in spaced relation with the whole peripheral boundaries of the cell while at the same time replacing the second power line 408 with the second grounding line brings a plurality of power supplies.

Also, apart from the plural-power-supply cell Cp2 twice as tall as the single-power-supply cell Un1 shown in FIG.

10, it is possible to provide the plural-power-supply cell Cp2 fourth times as tall as the single-power-supply cell Un1 with two systems of grounding lines. A plurality of power supplies can be provided for the grounding lines as well as for the power lines.

Figure 20:
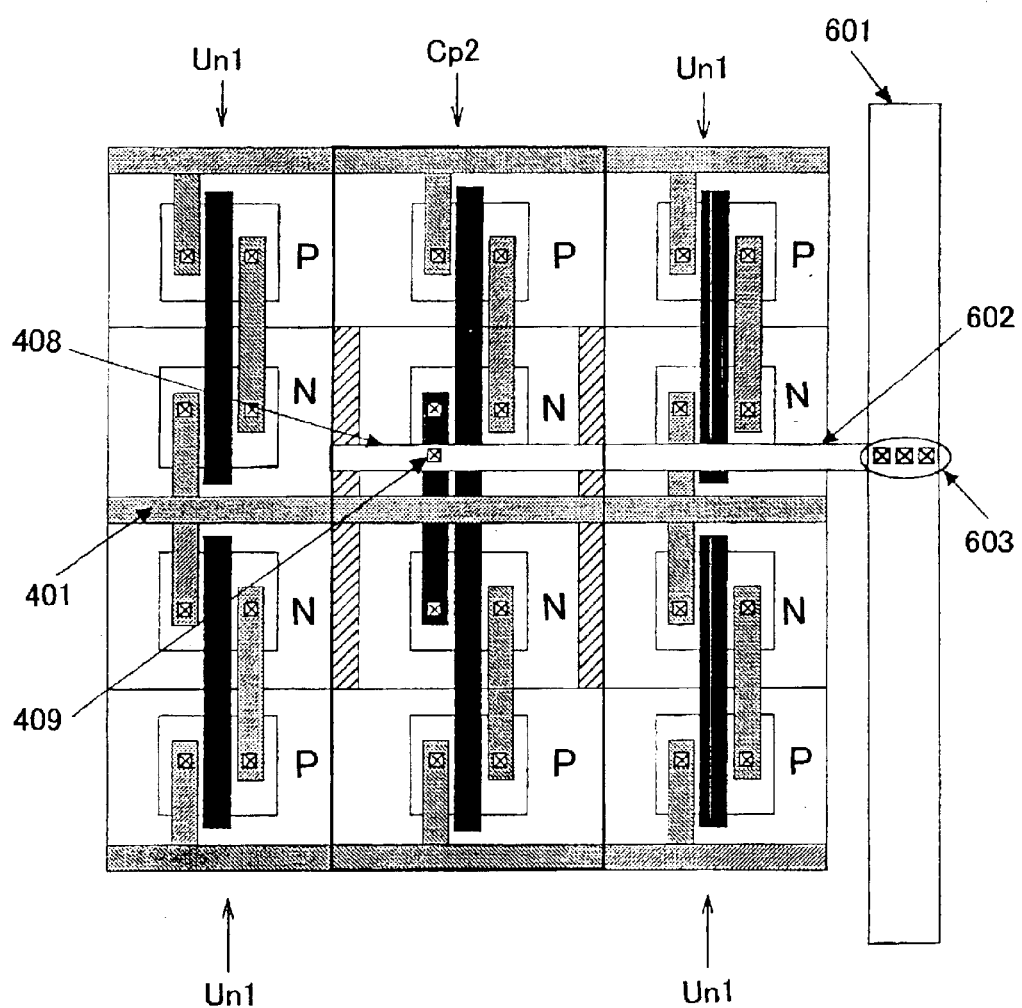
FIG. 20 is a wiring diagram (No. 1) of the second power lines of the plural-power-supply cells according to the invention.

FIG. 20 shows a wiring example of the case in which the single-power-supply cells Un1 and the plural-power-supply cell Cp2 are existent in the same row and the second power line 408 of the plural-power-supply cell Cp2 is wired with a block layout. First, the power strap wire 601 is connected in the first wiring layer, and the second power line 408 of the plural-power-supply cell Cp2 is connected to the power strap wire 601 through the power line 602 in the second wiring layer. In this connection, a contact 603 is arranged at the superposed point of the power strap wire 601 and the power line 602. The first power lines 401 are connected to each other by arranging the cells in contact with each other. In this way, both the first power line 401 and the second power line 408 can be wired in a block layout.

Figure 21:
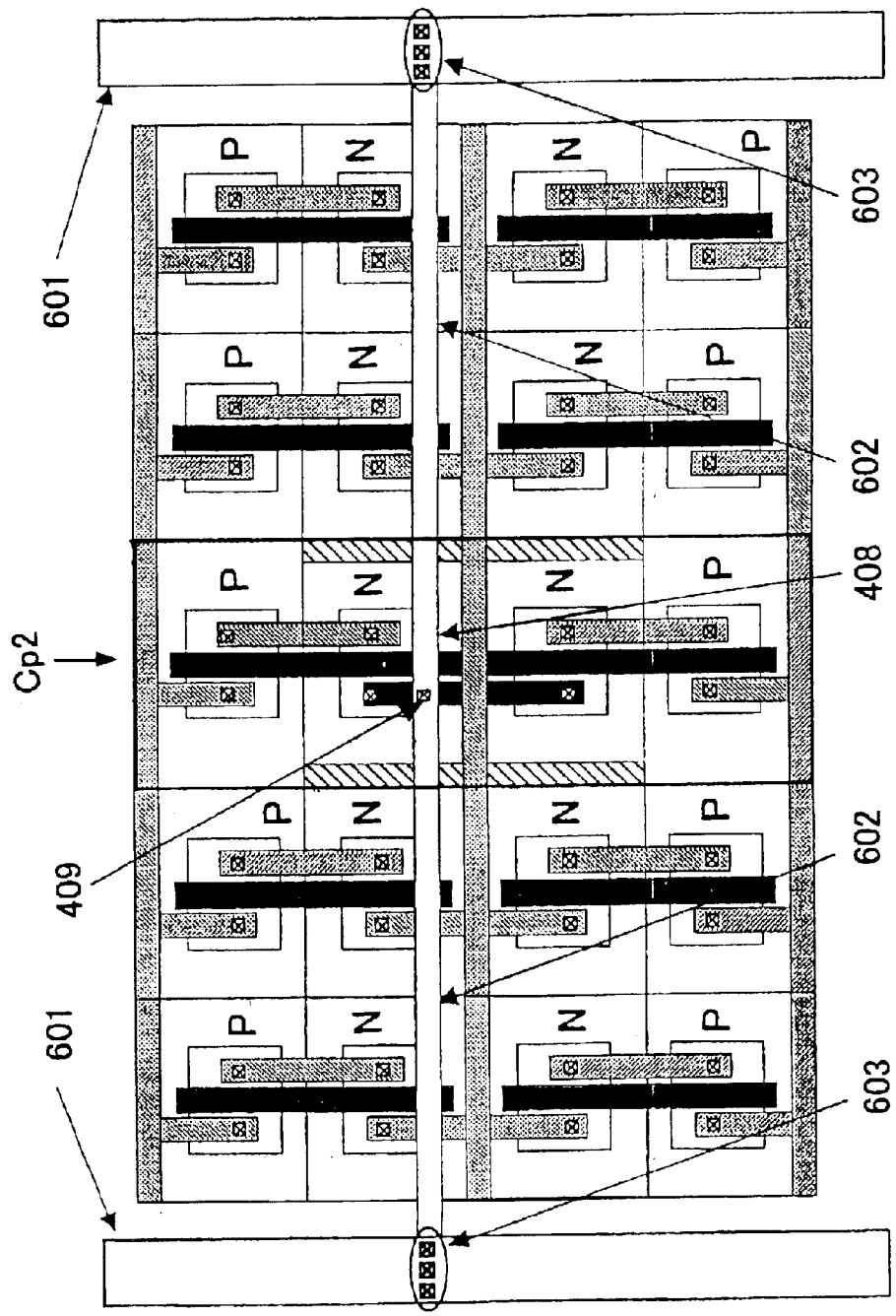
FIG. 21 is a wiring diagram (No. 2) of the second power lines of the plural-power-supply cells according to the invention.

The example explained above represents a case in which one power strap wire 601 is connected. As an alternative, a plurality of the power strap wires 601 may be prepared for connection. Also, as shown in FIG. 21, two power strap wires 601 may be prepared on both sides of the plural-power-supply cell Cp2, and the power wire 602 may be connected using the second wiring layer from both ends of the plural-power-supply cell Cp2.

Figure 22:
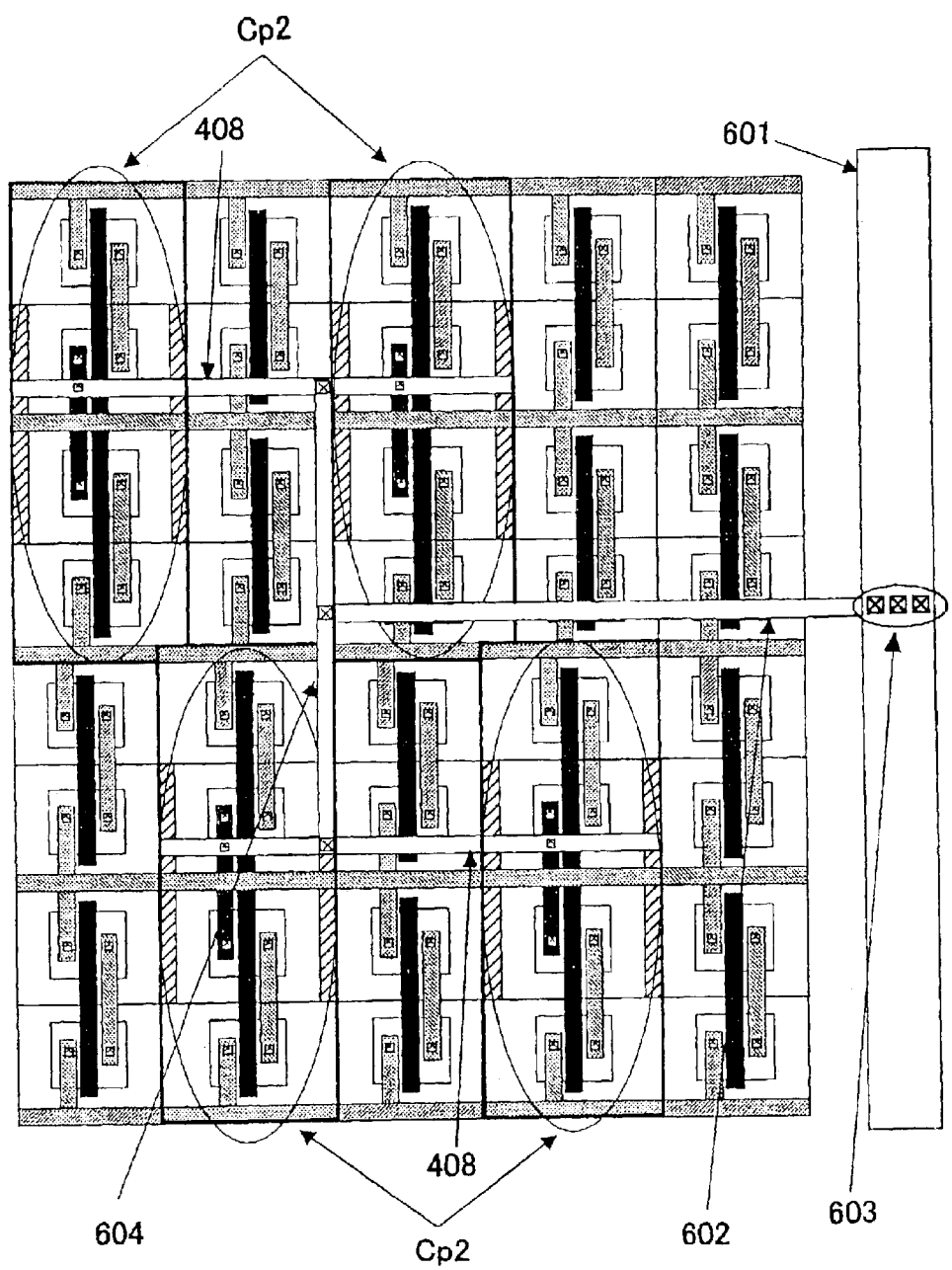
FIG. 22 is a wiring diagram (No. 3) of the second power lines of the plural-power-supply cells according to the invention.

FIG. 22 shows a case in which a plurality of cell rows are aligned and a plurality of the plural-power-supply cells Cp2 exist in different rows. First, the power strap wire 601 is connected in the first wiring layer. Also, the second power lines 408 of the plural-power-supply cells Cp2 are connected to each other through vertical partial wires 604. In the second wiring layer, on the other hand, the power line 602 is connected to the power strap wire 601 from the partial wire 604, and a contact 603 is arranged at the superposed point of the two wires. As a result, even in the presence of the plural-power-supply cell Cp2 in each of a plurality of rows, the power line 602 is not required to be connected for each row. In this way, the number of required wiring resources is reduced. In the case where the power line 602 is connected for each row, there would be required a greater number of wiring resources, and the requirement is difficult to meet in the case where the signal wire and the power line are required to be used in the same wiring area. In the worst case, the signal wiring would become impossible. This inconvenience can be avoided by the method in which the partial wires 604 are used for combination of the wiring.

As another alternative, a plurality of the power strap wires 601 are prepared so that each of the power strap wires 601 is connected from the partial wire 604.

Figure 23:
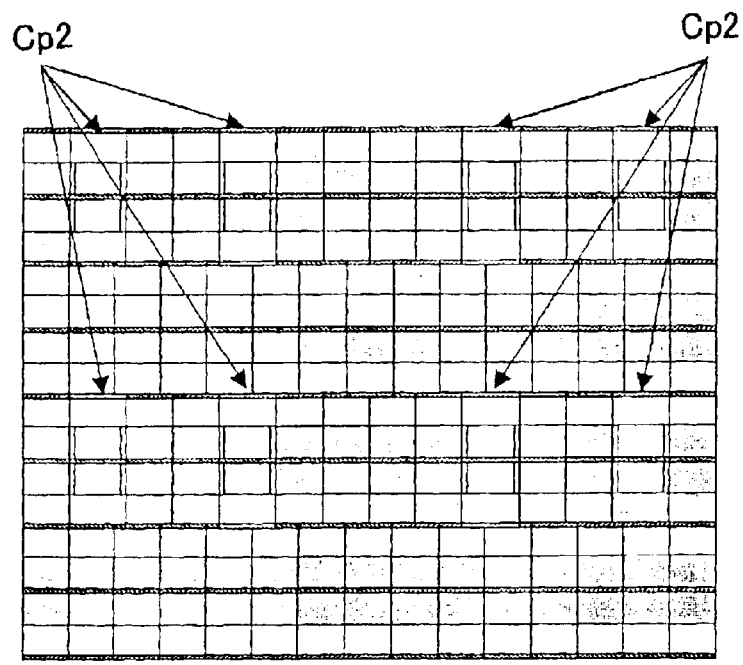
FIG. 23 is a diagram for explaining a first method of suppressing the source voltage drop using a plural-power-supply cell according to the invention.
Figure 24:
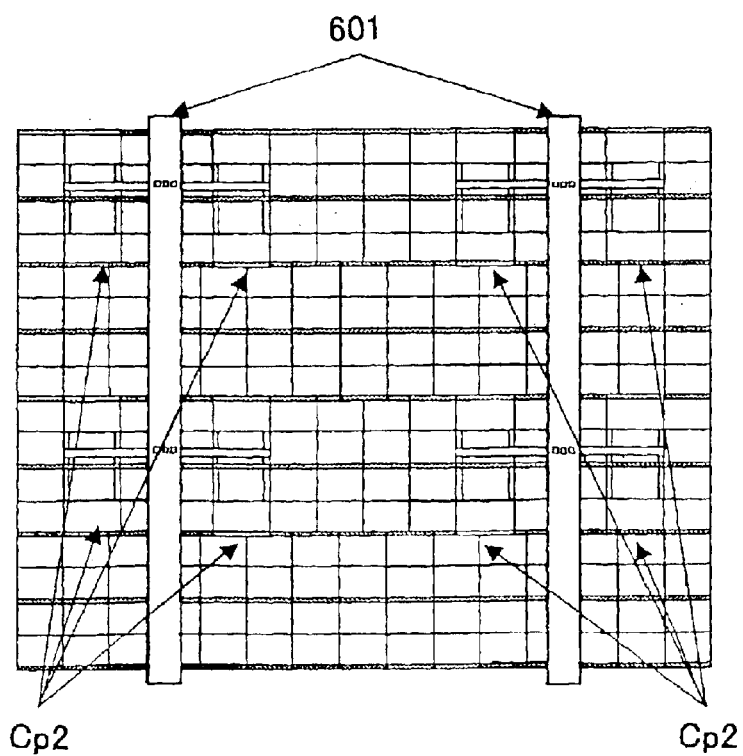
FIG. 24 is a diagram for explaining the first method of suppressing the source voltage drop using a plural-power-supply cell according to the invention.

An increased wiring length of the power line 602 would increase the wiring resistance and the resulting source voltage drop would cause the shortage of the operating speed or the malfunction of the circuit. A method of avoiding this inconvenience and suppressing the drop of the source voltage will be explained with reference to FIGS. 23 and 24. In the case where a plurality of the plural-power-supply cells Cp2 are distributively arranged, the power strap wire 601 is arranged on condition that the wiring length with each of the plural-power-supply cells Cp2 is not more than a restricted value. By maintaining the wiring length at not more than the restricted value in this way, the source voltage drop can be suppressed.

The wiring resistance instead of the wiring length may be restricted, and the source voltage drop can be controlled by arranging the power strap wire 601 in such a manner that the wiring resistance value is not higher than the restricted value. Alternatively, the source voltage drop value of the plural-power-supply cells Cp2 may be restricted, and the source voltage drop can be controlled by arranging the power strap wire 601 in such a manner that the source voltage drop value is not higher than the restricted value. Incidentally, the source voltage drop value can be determined by determining the current value for driving the plural-power-supply cells Cp2 and then by using this current value and the wiring resistance value between the power strap wire 601 and the plural-power-supply cells Cp2.

Although the example described above represents a case in which the power strap wire 601 is arranged in such a way that the wiring length with the plural-power-supply cells Cp2 is short after arranging the plural-power-supply cells Cp2, the plural-power-supply cells Cp2 may alternatively be arranged in the neighborhood of the power strap wire 601 after connecting the power strap wire 601.

Figure 25:
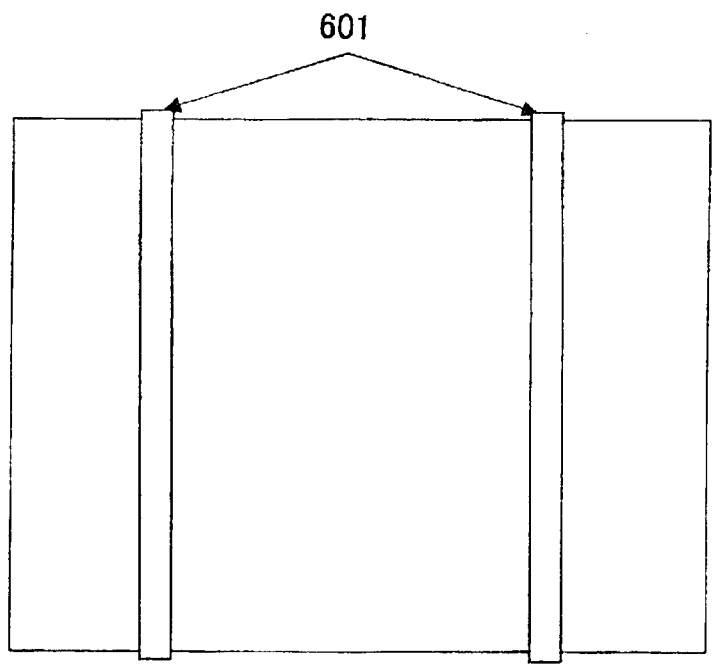
FIG. 25 is a diagram for explaining a second method of suppressing the source voltage drop using a plural-power-supply cell according to the invention.
Figure 26:
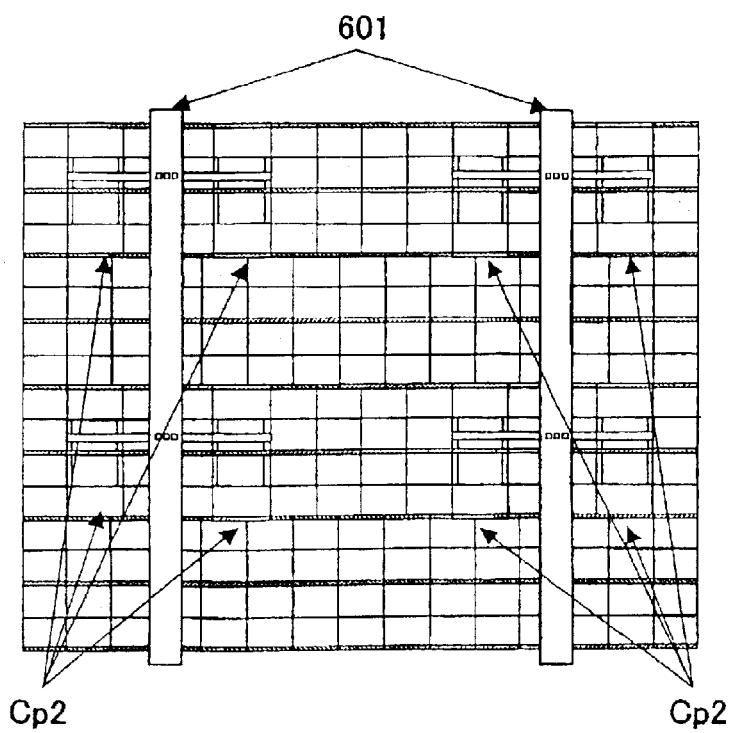
FIG. 26 is a diagram for explaining the second method of suppressing the source voltage drop using a plural-power-supply cell according to the invention.

FIGS. 25 and 26 show another method. The wiring length, the wiring resistance value or the source voltage drop value between the power strap wire 601 and the plural-power-supply cells Cp2 is restricted. The source voltage drop can thus be suppressed by arranging the plural-power-supply cells Cp2 on condition that the restricted value is not exceeded.

Figure 27:
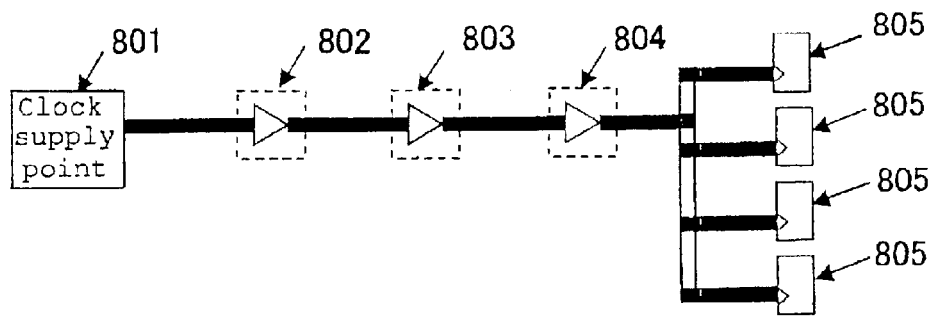
FIG. 27 is a diagram showing a configuration of a semiconductor integrated device comprising a clock tree portion including the plural-power-supply cells according to the invention.

As shown in FIG. 27, first to third clock buffers 802 to 804 are configured of the plural-power-supply cells in a clock tree portion where the clock signal output from a clock supply point 801 is distributed to flip-flops 805 through the first to third clock buffers 802 to 804. The potential of the second power line in the clock buffers 802 to 804 is reduced below the potential of the first power line. In this way, the amplitude of the clock signal of the clock buffers 802 to 804 is reduced, thereby making it possible to decrease the power consumption of the clock tree portion.

Figure 28:
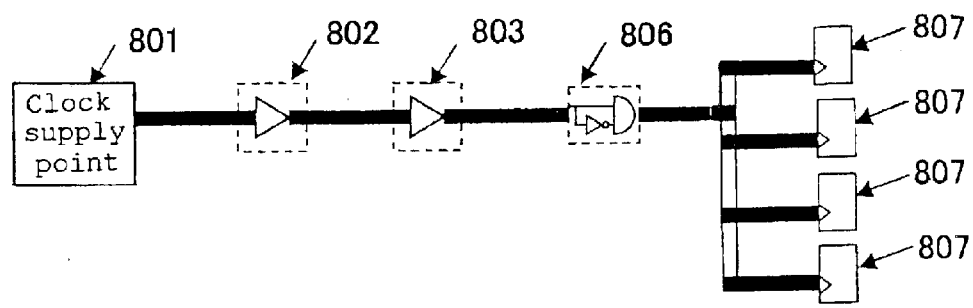
FIG. 28 is a diagram showing a configuration of a semiconductor integrated device comprising a clock tree portion including the plural-power-supply cells, a pulse generating circuit and a latch according to the invention.

FIG. 28 shows a case in which the third clock buffer 804 in the circuit of FIG. 27 is replaced by a pulse generating circuit 806 and the flip-flops 805 are replaced by latches 807. The function equivalent to the flip-flops can be realized by the pulse generating circuit and the latches. By replacing the flip-flops with the latches, the power consumption of the circuit can be reduced.

Figure 29A:
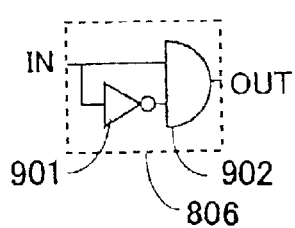
FIG. 29A is a circuit diagram showing a pulse generating circuit.
Figure 29B:
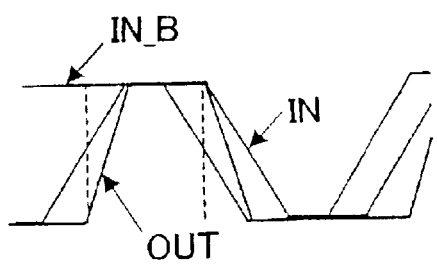
FIG. 29B is a diagram showing an operation waveform of the pulse generating circuit.

As shown in FIG. 29A, the pulse generating circuit 806 is configured of an inverter 901 and a two-input AND gate 902. The AND gate 902 is supplied with an input signal IN and an inverted signal IN_B inverted from the input signal IN by the inverter 901. As shown in FIG. 29B, an output signal OUT rises at the rise point of the input signal IN and falls at the fall point of the inverted signal IN_B. The clock signal output from the clock supply point 801 is relayed through the first and second clock buffers 802, 803 and the pulse generating circuit 806 thereby to generate a pulse which is distributed to the latches 807. The potential of the second power line of the clock buffers 802, 803 and the pulse generating circuit 806 is reduced below the potential of the first power line. In this way, the amplitude of the pulse signals of the clock buffers 802, 803 and the pulse signal of the pulse generating circuit 806 can be reduced thereby to reduce the power consumption of the clock tree portion. Also, the power consumption of the whole circuit can be reduced by replacing the flip-flops with the latches.

Figure 30:
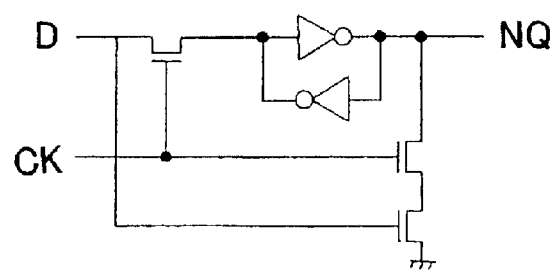
FIG. 30 is a diagram showing a latch with a circuit made up of an N-channel transistor.

With a circuit configuration in which the output signal of a plural-power-supply cell is received by a single-power-supply cell, the P-channel transistor in the single-power-supply cell is not turned off and the leakage current is generated in the case where the potential of the second power line is lower than that of the first power line. In order to prevent the leakage current, therefore, the single-power-supply cell is so configured that the output signal of the plural-power-supply cell is received by an N-channel transistor (Japanese Unexamined Patent Publication No. 6-164331). As shown in FIG. 30, the clock signal of a latch is received only by the N-channel transistor. The use of the circuit shown in FIG. 30 for each of the latches 807 shown in FIG. 28 can prevent the leakage current.

Figure 31:
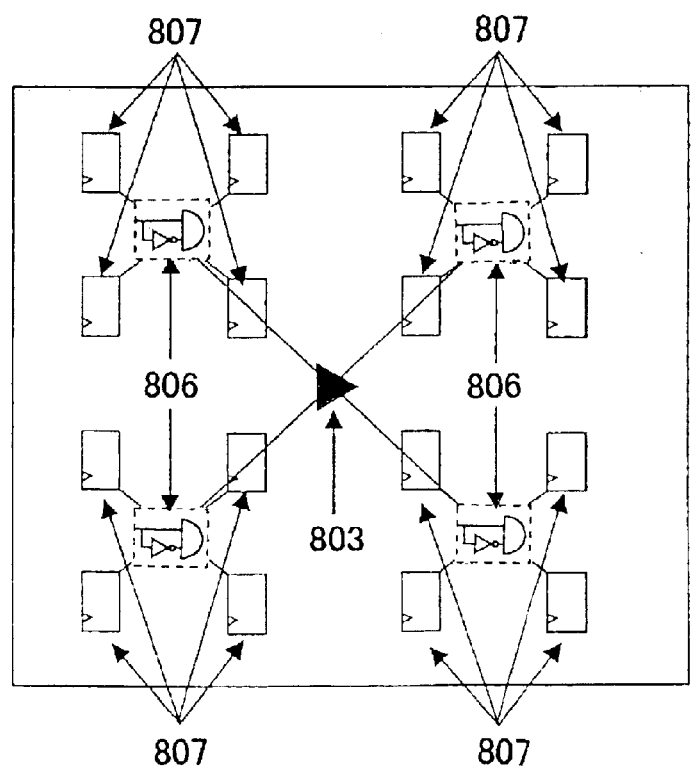
FIG. 31 is a diagram showing a block layout using the plural-power-supply cells in a clock tree portion according to the invention.

In the clock tree portion shown in FIG. 31, the clock signal is applied from the central first clock buffer 803 to a plurality of pulse generating circuits 806 arranged radially at equal intervals. Further, the clock signal is supplied synchronously to a plurality of latches 807 arranged at radially equal intervals. In this case, the pulse signal can be applied synchronously to all the latches 807.

Figure 32:
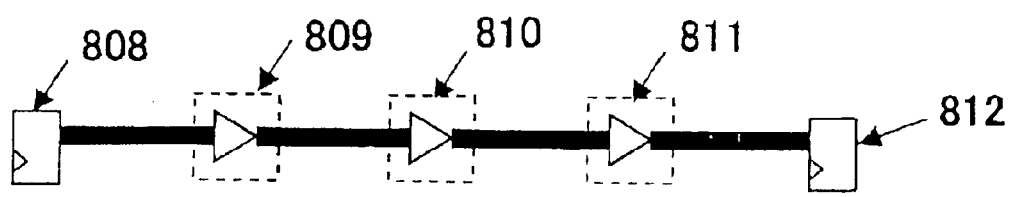
FIG. 32 is a diagram showing a configuration of a semiconductor integrated device using the plural-power-supply cells in a circuit element string according to the invention.

In FIG. 32, assume that each of the first to third circuit elements 809 to 811 between the first flip-flop 808 and the second flip-flop 812 is configured of a single-power-supply cell, which causes the deficiency of the operating speed. In view of this, the first to third circuit elements 809 to 811 are replaced with the plural-power-supply cells, and driven with the second power line higher in potential than the first power line. In this way, the operating speed of the circuit elements 809 to 811 can be increased for a higher operating speed of the circuit element string.

With a circuit configuration in which the output signal of a single-power-supply cell is received by a plural-power-supply cell, an assumed fact that the potential of the second power line is higher than that of the first power line fails to turn off the P-channel transistor in the plural-power-supply cell, thereby generating a leakage current. In order to prevent this leakage current, the plural-power-supply cell is so configured that the output signal of the single-power-supply cell is received by the N-channel transistor.

Figure 33:
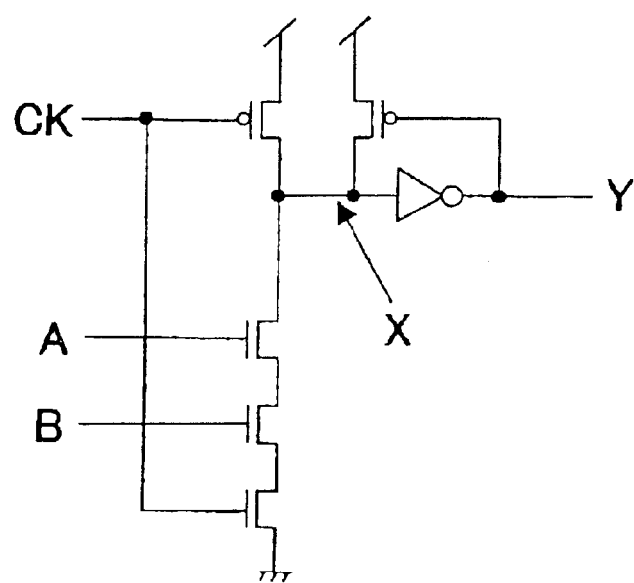
FIG. 33 is a diagram showing a domino circuit.

A configuration in which the N-channel transistor receives the output signal of the single-power-supply cell is realized by a domino circuit including an AND circuit as shown in FIG. 33. While the clock signal CK is at L level, the portion X is charged to H level. Assume that the clock signal CK rises to H level, on the other hand. In the case where the portions A and B are at H level, the portion X is discharged and the portion Y rises to H level. In the case where the portion A or B is at L level, on the other hand, the charge of the portion X remains unchanged even when the clock signal CK rises to H level, and therefore the portion Y falls to L level.

The power consumption of a circuit element string can be reduced by using the plural-power-supply cells for the circuit element string having a margin of the operating speed instead of the plural-power-supply cells for the circuit element string lacking the operating speed and by reducing the potential of the second power line below that of the first power line to reduce the amplitude of the signal of the circuit element string.

In the case where a cell having a large peak current and a cell having a small peak current are used in the same block, the power noise of the cell having a large peak current is propagated to the cell having a small peak current, thereby causing a reduced operating speed and a malfunction of the circuit. To prevent this, the source potential is supplied to the cell having a large peak current through the second power line using the plural-power-supply cell, while the source potential is supplied to the cell having a small peak current through the first power line using the single-power-supply cell. With this configuration, different power lines are used for the cells of a large peak current and those of a small peak current. In this way, the power noise of a cell having a large peak current can be prevented from being propagated to a cell having a small peak current.

The effects of the invention explained above will be summarized as follows.

The plural-power-supply cell includes a first power line and a second power line, and has an N well arranged in spaced relation with the whole periphery of the cell boundaries. Even in the case where adjacent cells are arranged in contact with each other along the direction orthogonal to the power lines, therefore, the N well of the plural-power-supply cell can be isolated from the N wells of adjacent cells. As a result, the layout of a semiconductor integrated circuit having a plurality of source voltages can be designed with a suppressed area increase.

By increasing the height of the plural-power-supply cell a multiple of times that of the single-power-supply cell, the area of the N well can be increased. Also, since more substrate contacts can be secured, the latch-up can be increased in strength.

On the other hand, the N well of the plural-power-supply cell is electrically isolated from the first and second power lines, and connected to the first and second power lines by wiring or contacts. As a result, the potential of the N well of the plural-power-supply cell can be switched between the first power line and the second power line.

Further, a plural-power-supply cell is prepared in which the N well is in contact with one or the other or both of the boundaries along the direction of the power lines. As a result, a plurality of the plural-power-supply cells can be arranged adjacently to each other with the N wells thereof kept in contact with each other.

Also, the power strap wire formed on the first wiring layer and the second power line of the plural-power-supply cell are connected to each other by means of the second wiring layer. In this way, the second power lines of the plural-power-supply cells can be connected in blocks.

Furthermore, the second power lines of a plurality of plural-power-supply cells are connected by a partial wiring which in turn is connected with the power strap wire. In this way, the wiring of the second power lines is made possible by small wiring resources.

Also, the plural-power-supply cells are arranged in such a manner that the shortest distance between the power strap wire and the plural-power-supply cells is not more than a restricted value. As a result, the source voltage drop of the second power lines of the plural-power-supply cells can be suppressed.

Further, the potential of the second power line is reduced by using the plural-power-supply cells for the clock tree portion, with the result that the power consumption of the clock tree portion can be reduced. Also, the potential of the second power line is increased by using the plural-power-supply cells in a circuit element string having an insufficient operating speed, thereby making it possible to increase the operating speed of the circuit element string.

Also, the potential of the second power line is reduced using the plural-power-supply cells in the circuit element string having a margin of the operating speed. As a result, the power consumption of the circuit element string can be reduced.

In addition, a plural-power-supply cell is used for a cell having a large peak current, so that different power lines are used for the cells having a small peak current and the cells having a large peak current. In this way, the power noise of the cells having a large peak current is prevented from being propagated to the cells having a small peak current.

What is claimed is:

1. A standard cell having an N-well region and a P-well region for a plurality of power supplies applicable to the automatic layout wiring of a semiconductor integrated circuit, said standard cell comprising a first power line, a second power line isolated electrically from said first power line, an N well arranged in spaced relation with the whole periphery of the boundaries of said cell, a grounding line and a P well arranged in contact with the boundaries on both sides along the direction of said power lines of said standard cell.

2. A standard cell according to claim 1, wherein said second power line is formed in contact with the boundaries on both sides along the direction of said power lines of said standard cell.

3. A standard cell according to claim 1, wherein said N well is electrically connected to said second power line, and said P well is electrically connected to said grounding line.

4. A standard cell according to claim 1, wherein said N well is electrically connected to selected one of said first power line and said second power line by selected one of a wiring and a contact.

5. A standard cell according to claim 1, further comprising a decoupling capacitor connected to said second power line.

6. A standard cell according to claim 1, further comprising a third power line.

7. A standard cell according to claim 1, further comprising a second N well arranged at each end on the two sides of said standard cell along the direction of said power lines.

8. A standard cell according to claim 7, wherein said second N well is electrically connected with said first power line.

9. A standard cell according to claim 7, further comprising a third N well arranged in spaced relation with the boundaries on both sides along said power lines of said standard cell.

10. A library for a standard cell having an N-well, region and a P-well region used for the automatic layout wiring of a semiconductor integrated circuit, said standard cell including a first power line, a second power line isolated electrically from said first power line, an N well arranged in spaced relation with the boundaries on both sides orthogonal to the direction of said power lines of said standard cell, a grounding line and a P well arranged in contact with the boundaries on both sides along the direction of said power lines of said standard cell, wherein said library for a standard cell includes a combination of at least a first cell having said N well arranged in spaced relation with said boundaries on both sides along the direction of said power lines of said first cell and at least a second cell having said N well arranged in contact with selected one of a first end, a second end and both of said first and second ends along the direction of said power lines of said second cell.

11. A library for a standard cell having an N-well region and a P-well region used for the automatic layout wiring of a semiconductor integrated circuit, said standard cell including a combination of at least a standard cell for a plurality of power supplies and at least a standard cell for a single power supply, wherein said standard cell for a plurality of power supplies includes a first power line, a second power line isolated electrically from said first power line, an N well arranged in spaced relation with the whole periphery of the boundaries of said standard cell, a grounding line and a P well arranged in contact with the boundaries on both sides along the direction of said power lines of said standard cell, and wherein said standard cell for a single power supply includes a first power line, an N well arranged in contact with the boundaries on both sides along the direction of said power lines of said standard cell, a grounding line and a P well arranged in contact with the boundaries on both sides along the direction of said power lines of said standard cell.

12. A library according to claim 11, wherein said standard cell for a plurality of power supplies has a height an integer multiple of the height of said standard cell for a single power supply.

13. A method of wiring power supplies using a library according to claim 11, wherein a power strap wiring is prepared using a first wiring layer, and the second power line of said standard cell for a plurality of power supplies and said power strap wiring are connected to each other using a second wiring layer.

14. A method of wiring power supplies using a library according to claim 11, wherein a plurality of power strap wirings are prepared using a first wiring layer, and the second power line of said standard cell for a plurality of power supplies and a plurality of said power strap wirings are connected to each other using a second wiring layer.

15. A method of wiring power supplies using a library according to claim 11, wherein a power strap wiring is prepared using a first wiring layer, and a partial wiring connected with said second power line of said standard cell for a plurality of power supplies is connected to said power strap wiring using a second wiring layer.

16. A method of wiring power supplies using a library according to claim 11, wherein a plurality of power strap wirings are prepared using a first wiring layer, and the partial wiring connected with said second power line of said standard cell for a plurality of power supplies is connected to a plurality of said power strap wirings using a second wiring layer.

17. A method of wiring power supplies according to claim 11, wherein said power strap wiring is arranged in such a manner that the shortest distance from said power strap wiring to said standard cell for a plurality of power supplies is not more than a predetermined value after arranging said standard cell.

18. A method of wiring power supplies according to claim 11, wherein said power strap wiring is arranged in such a manner that the resistance value from said power strap wiring to said standard cell for a plurality of power supplies is not more than a predetermined value after arranging said standard cell.

19. A method of wiring power supplies according to claim 11, wherein said power strap wiring is arranged in such a manner that the source voltage drop value from said power strap wiring to said standard cell for a plurality of power supplies is not more than a predetermined value after arranging said standard cell.

20. A method of wiring power supplies according to claim 11, wherein said standard cell for a plurality of power supplies is arranged in such a manner that the shortest distance from said power strap wiring to said standard cell is not more than a predetermined value after arranging said power strap wiring.

21. A method of wiring power supplies according to claim 11, wherein said standard cell for a plurality of power supplies is arranged in such a manner that the resistance value from said power strap wiring to said standard cell is not more than a predetermined value after arranging said power strap wiring.

22. A method of wiring power supplies according to claim 11, wherein said standard cell for a plurality of power supplies is arranged in such a manner that the source voltage drop value from said power strap wiring to said standard cell is not more than a predetermined value after arranging said power strap wiring.

23. A semiconductor integrated device using a library according to claim 11, comprising said standard cell for a plurality of power supplies used as a clock tree portion.

24. A semiconductor integrated device using a library for a standard cell according to claim 23, wherein the potential of said second power line of said standard cell for a plurality of power supplies is decreased below the potential of said first power line.

25. A semiconductor integrated device using a library for a standard cell according to claim 24, wherein said clock tree portion is connected to a latch, and the last stage of said clock tree portion makes up a pulse generating circuit.

26. A semiconductor integrated device using a library according to claim 11, wherein said standard cell for a plurality of power supplies is used for a circuit element string portion deficient of the operating speed.

27. A semiconductor integrated device using a library according to claim 11, wherein said standard cell for a plurality of power supplies is used for a circuit element string portion deficient of the operating speed, and wherein the potential of said second power line of said standard cell for a plurality of power supplies is increased beyond the potential of said first power line.

28. A semiconductor integrated device using a library according to claim 11, wherein said standard cell for a plurality of power supplies is used for a circuit element string portion having a margin of the operating speed.

29. A semiconductor integrated device using a library according to claim 11, wherein said standard cell for a plurality of power supplies is used for a circuit element string portion having a margin of the operating speed, and wherein the potential of said second power line of said standard cell for a plurality of power supplies is reduced below the potential of said first power line.

30. A semiconductor integrated device using a library according to claim 11, comprising at least a first standard cell having a large peak current and at least a second standard cell having a small peak current, wherein said standard cell for a plurality of power supplies is used as said first standard cell having a large peak current.

* * * * *

UNITED STATES PATENT AND TRADEMARK OFFICE
CERTIFICATE OF CORRECTION

PATENT NO.    : 6,818,929 B2
DATED         : November 16, 2004
INVENTOR(S)   : Masanori Tsutsumi et al.

It is certified that error appears in the above-identified patent and that said Letters Patent is hereby corrected as shown below:

Column 18,
Lines 43, 49, 55, 61 and 67, change "11" to -- 13 --.

Column 19,
Line 6, change "11" to -- 13 --.
Lines 14, 15, 19 and 20, change "A semiconductor integrated device using a library for a for a standard cell" to -- A semiconductor integrated device --.

Signed and Sealed this

Twenty-second Day of November, 2005

JON W. DUDAS
*Director of the United States Patent and Trademark Office*